US007588677B2

(12) United States Patent
Lee et al.

(10) Patent No.: US 7,588,677 B2
(45) Date of Patent: Sep. 15, 2009

(54) METHODS AND APPARATUS FOR ELECTRICAL, MECHANICAL AND/OR CHEMICAL REMOVAL OF CONDUCTIVE MATERIAL FROM A MICROELECTRONIC SUBSTRATE

(75) Inventors: Whonchee Lee, Boise, ID (US); Scott G. Meikle, Gainesville, VA (US); Scott E. Moore, Nampa, ID (US); Trung T. Doan, Vallejo, CA (US)

(73) Assignee: Micron Technology, Inc., Boise, ID (US)

( * ) Notice: Subject to any disclaimer, the term of this patent is extended or adjusted under 35 U.S.C. 154(b) by 248 days.

(21) Appl. No.: 11/451,723

(22) Filed: Jun. 12, 2006

(65) Prior Publication Data

US 2006/0234604 A1   Oct. 19, 2006

Related U.S. Application Data

(60) Division of application No. 09/888,084, filed on Jun. 21, 2001, now Pat. No. 7,112,121, which is a continuation-in-part of application No. 09/888,002, filed on Jun. 21, 2001, now Pat. No. 7,160,176, and a continuation-in-part of application No. 09/887,767, filed on Jun. 21, 2001, now Pat. No. 7,094,131, and a continuation-in-part of application No. 09/651,779, filed on Aug. 30, 2000, now Pat. No. 7,074,113.

(51) Int. Cl.
*B23H 5/06* (2006.01)
(52) U.S. Cl. ........................ 205/662; 205/640
(58) Field of Classification Search ............... 205/640, 205/662
See application file for complete search history.

(56) References Cited

U.S. PATENT DOCUMENTS 2,315,695 A    4/1943   Faust
(Continued)

FOREIGN PATENT DOCUMENTS

EP          0459397 A2    12/1991
(Continued)

OTHER PUBLICATIONS

U.S. Appl. No. 09/653,411, filed Aug. 31, 2000, Lee et al.
(Continued)

*Primary Examiner*—Harry D. Wilkins, III
*Assistant Examiner*—Nicholas A. Smith
(74) *Attorney, Agent, or Firm*—Perkins Coie LLP

(57) ABSTRACT

A method and apparatus for removing conductive material from a microelectronic substrate. In one embodiment, the method can include engaging a microelectronic substrate with a polishing surface of a polishing pad, electrically coupling a conductive material of the microelectronic substrate to a source of electrical potential, and oxidizing at least a portion of the conductive material by passing an electrical current through the conductive material from the source of electrical potential. For example, the method can include positioning first and second electrodes apart from a face surface of the microelectronic substrate and disposing an electrolytic fluid between the face surface and the electrodes with the electrodes in fluid communication with the electrolytic fluid. The method can further include removing the portion of conductive material from the microelectronic substrate by moving at least one of the microelectronic and the polishing pad relative to the other. Accordingly, metals such as platinum can be anisotropically removed from the microelectronic substrate. The characteristics of the metal removal can be controlled by controlling the characteristics of the electrical signal applied to the microelectronic substrate, and the characteristics of a liquid disposed between the microelectronic substrate and the polishing pad.

20 Claims, 10 Drawing Sheets

U.S. PATENT DOCUMENTS

| | | |
|---|---|---|
| 2,516,105 A | 7/1950 | Der Mateosian |
| 3,239,439 A | 3/1966 | Helmke |
| 3,334,210 A | 8/1967 | Williams et al. |
| 4,613,417 A | 9/1986 | Laskowski et al. |
| 4,839,005 A | 6/1989 | Katsumoto et al. |
| 5,098,533 A | 3/1992 | Duke et al. |
| 5,162,248 A | 11/1992 | Dennison et al. |
| 5,244,534 A | 9/1993 | Yu et al. |
| 5,300,155 A | 4/1994 | Sandhu et al. |
| 5,344,539 A | 9/1994 | Shinogi et al. |
| 5,562,529 A | 10/1996 | Kishii et al. |
| 5,567,300 A | 10/1996 | Datta et al. |
| 5,575,885 A | 11/1996 | Hirabayashi et al. |
| 5,618,381 A | 4/1997 | Doan et al. |
| 5,624,300 A | 4/1997 | Kishii et al. |
| 5,676,587 A | 10/1997 | Landers et al. |
| 5,681,423 A | 10/1997 | Sandhu et al. |
| 5,780,358 A | 7/1998 | Shou et al. |
| 5,800,248 A | 9/1998 | Pant et al. |
| 5,807,165 A | 9/1998 | Uzoh et al. |
| 5,840,629 A | 11/1998 | Carpio |
| 5,843,818 A | 12/1998 | Joo et al. |
| 5,846,398 A | 12/1998 | Carpio |
| 5,863,307 A | 1/1999 | Zhou et al. |
| 5,888,866 A | 3/1999 | Chien |
| 5,897,375 A | 4/1999 | Watts et al. |
| 5,911,619 A | 6/1999 | Uzoh et al. |
| 5,930,699 A | 7/1999 | Bhatia |
| 5,934,980 A | 8/1999 | Koos et al. |
| 5,952,687 A | 9/1999 | Kawakubo et al. |
| 5,954,975 A | 9/1999 | Cadien et al. |
| 5,954,997 A | 9/1999 | Kaufman et al. |
| 5,972,792 A | 10/1999 | Hudson |
| 5,993,637 A | 11/1999 | Hisamatsu |
| 6,001,730 A | 12/1999 | Farkas et al. |
| 6,007,695 A | 12/1999 | Knall et al. |
| 6,010,964 A | 1/2000 | Glass |
| 6,024,856 A | 2/2000 | Haydu et al. |
| 6,033,953 A | 3/2000 | Aoki et al. |
| 6,039,633 A | 3/2000 | Chopra |
| 6,046,099 A | 4/2000 | Cadien et al. |
| 6,051,496 A | 4/2000 | Jang |
| 6,060,386 A | 5/2000 | Givens |
| 6,060,395 A | 5/2000 | Skrovan et al. |
| 6,063,306 A | 5/2000 | Kaufman et al. |
| 6,066,030 A | 5/2000 | Uzoh |
| 6,066,559 A | 5/2000 | Gonzalez et al. |
| 6,068,787 A | 5/2000 | Grumbine et al. |
| 6,077,412 A | 6/2000 | Ting et al. |
| 6,083,840 A | 7/2000 | Mravic et al. |
| 6,100,197 A | 8/2000 | Hasegawa |
| 6,103,096 A | 8/2000 | Datta et al. |
| 6,103,628 A | 8/2000 | Talieh |
| 6,103,636 A | 8/2000 | Zahorik et al. |
| 6,115,233 A | 9/2000 | Seliskar et al. |
| 6,117,781 A | 9/2000 | Lukanc et al. |
| 6,121,152 A | 9/2000 | Adams et al. |
| 6,132,586 A | 10/2000 | Adams et al. |
| 6,143,155 A | 11/2000 | Adams et al. |
| 6,162,681 A | 12/2000 | Wu |
| 6,171,467 B1 | 1/2001 | Weihs et al. |
| 6,174,425 B1 | 1/2001 | Simpson et al. |
| 6,176,992 B1 | 1/2001 | Talieh |
| 6,180,947 B1 | 1/2001 | Stickel et al. |
| 6,187,651 B1 | 2/2001 | Oh |
| 6,190,494 B1 | 2/2001 | Dow |
| 6,196,899 B1 | 3/2001 | Chopra et al. |
| 6,197,182 B1 | 3/2001 | Kaufman |
| 6,206,756 B1 | 3/2001 | Chopra et al. |
| 6,218,309 B1 | 4/2001 | Miller et al. |
| 6,250,994 B1 | 6/2001 | Chopra et al. |
| 6,259,128 B1 | 7/2001 | Adler et al. |
| 6,273,786 B1 | 8/2001 | Chopra et al. |
| 6,276,996 B1 | 8/2001 | Chopra |
| 6,280,581 B1 | 8/2001 | Cheng |
| 6,287,974 B1 | 9/2001 | Miller |
| 6,299,741 B1 | 10/2001 | Sun et al. |
| 6,303,956 B1 | 10/2001 | Sandhu et al. |
| 6,313,038 B1 | 11/2001 | Chopra et al. |
| 6,322,422 B1 | 11/2001 | Satou |
| 6,328,632 B1 | 12/2001 | Chopra |
| 6,368,184 B1 | 4/2002 | Beckage |
| 6,368,190 B1 | 4/2002 | Easter et al. |
| 6,379,223 B1 | 4/2002 | Sun et al. |
| 6,395,152 B1 | 5/2002 | Wang |
| 6,395,607 B1 | 5/2002 | Chung |
| 6,416,647 B1 | 7/2002 | Dordi et al. |
| 6,451,663 B1 | 9/2002 | Choi et al. |
| 6,455,370 B1 | 9/2002 | Lane |
| 6,461,911 B2 | 10/2002 | Ahn et al. |
| 6,464,855 B1 | 10/2002 | Chadda et al. |
| 6,504,247 B2 | 1/2003 | Chung |
| 6,515,493 B1 | 2/2003 | Adams et al. |
| 6,537,144 B1 | 3/2003 | Tsai et al. |
| 6,551,935 B1 | 4/2003 | Chopra et al. |
| 6,599,806 B2 | 7/2003 | Lee |
| 6,602,117 B1 | 8/2003 | Chopra et al. |
| 6,605,539 B2 | 8/2003 | Lee et al. |
| 6,607,988 B2 | 8/2003 | Yunogami et al. |
| 6,620,037 B2 | 9/2003 | Kaufman et al. |
| 6,632,335 B2 | 10/2003 | Kunisawa et al. |
| 6,689,258 B1 | 2/2004 | Lansford et al. |
| 6,693,036 B1 | 2/2004 | Nogami et al. |
| 6,705,926 B2 | 3/2004 | Zhou et al. |
| 6,722,942 B1 | 4/2004 | Lansford et al. |
| 6,722,950 B1 | 4/2004 | Dabral et al. |
| 6,726,823 B1 | 4/2004 | Wang et al. |
| 6,736,952 B2 | 5/2004 | Emesh et al. |
| 6,753,250 B1 | 6/2004 | Hill et al. |
| 6,776,693 B2 | 8/2004 | Duboust et al. |
| 6,780,772 B2 | 8/2004 | Uzoh et al. |
| 6,797,623 B2 | 9/2004 | Sato et al. |
| 6,808,617 B2 | 10/2004 | Sato et al. |
| 6,811,680 B2 | 11/2004 | Chen et al. |
| 6,846,227 B2 | 1/2005 | Sato et al. |
| 6,848,970 B2 | 2/2005 | Manens et al. |
| 6,852,630 B2 | 2/2005 | Basol et al. |
| 6,858,124 B2 | 2/2005 | Zazzera et al. |
| 6,867,136 B2 | 3/2005 | Basol et al. |
| 6,881,664 B2 | 4/2005 | Catabay et al. |
| 6,884,338 B2 | 4/2005 | Kesari et al. |
| 6,893,328 B2 | 5/2005 | So |
| 6,899,804 B2 | 5/2005 | Duboust et al. |
| 6,951,599 B2 | 10/2005 | Yahalom et al. |
| 6,977,224 B2 | 12/2005 | Dubin et al. |
| 7,074,113 B1 | 7/2006 | Moore |
| 7,078,308 B2 | 7/2006 | Lee et al. |
| 7,229,535 B2 | 6/2007 | Wang et al. |
| 2001/0035354 A1 | 11/2001 | Ashjaee et al. |
| 2002/0025759 A1 | 2/2002 | Lee et al. |
| 2002/0025760 A1 | 2/2002 | Lee et al. |
| 2002/0025763 A1 | 2/2002 | Lee et al. |
| 2002/0104764 A1 | 8/2002 | Banerjee et al. |
| 2002/0115283 A1 | 8/2002 | Ho et al. |
| 2003/0054729 A1 | 3/2003 | Lee et al. |
| 2003/0064669 A1 | 4/2003 | Basol et al. |
| 2003/0109198 A1 | 6/2003 | Lee et al. |
| 2003/0113996 A1 | 6/2003 | Nogami et al. |
| 2003/0127320 A1 | 7/2003 | Emesh et al. |
| 2003/0129927 A1 | 7/2003 | Lee et al. |
| 2003/0178320 A1 | 9/2003 | Liu et al. |
| 2003/0226764 A1 | 12/2003 | Moore et al. |
| 2003/0234184 A1 | 12/2003 | Liu et al. |
| 2004/0043582 A1 | 3/2004 | Chopra |

| | | | |
|---|---|---|---|
| 2004/0043705 A1 | 3/2004 | Lee et al. | |
| 2004/0154931 A1 | 8/2004 | Hongo et al. | |
| 2004/0192052 A1 | 9/2004 | Mukherjee et al. | |
| 2004/0259479 A1 | 12/2004 | Sevilla | |
| 2005/0016861 A1 | 1/2005 | Laursen et al. | |
| 2005/0020004 A1 | 1/2005 | Chopra | |
| 2005/0020192 A1 | 1/2005 | Lee et al. | |
| 2005/0034999 A1 | 2/2005 | Moore et al. | |
| 2005/0035000 A1 | 2/2005 | Moore et al. | |
| 2005/0056550 A1 | 3/2005 | Lee et al. | |
| 2005/0059324 A1 | 3/2005 | Lee et al. | |
| 2005/0133379 A1 | 6/2005 | Basol et al. | |
| 2005/0173260 A1 | 8/2005 | Basol et al. | |
| 2005/0178743 A1 | 8/2005 | Manens et al. | |
| 2005/0196963 A1 | 9/2005 | Lee | |
| 2006/0042956 A1 | 3/2006 | Lee et al. | |
| 2006/0163083 A1 | 7/2006 | Andricacos et al. | |

FOREIGN PATENT DOCUMENTS

| | | | |
|---|---|---|---|
| EP | 1 123 956 A1 | | 8/2001 |
| JP | 1241129 A | | 9/1989 |
| JP | 06120182 A | | 4/1994 |
| JP | 10335035 A | | 12/1998 |
| JP | 11145273 | | 5/1999 |
| JP | 2000269318 | | 9/2000 |
| JP | 2001077117 A1 | | 3/2001 |
| TW | 516471 | | 1/2003 |
| WO | WO-00/26443 A2 | | 5/2000 |
| WO | WO-00/28586 A2 | | 5/2000 |
| WO | WO-00/32356 A1 | | 6/2000 |
| WO | WO-00/59008 A2 | | 10/2000 |
| WO | WO-00/59682 A1 | | 10/2000 |
| WO | WO-02/064314 A1 | | 8/2002 |
| WO | WO-02085570 | | 10/2002 |
| WO | WO-0372672 | | 9/2003 |

OTHER PUBLICATIONS

U.S. Appl. No. 11/397,419, filed Apr. 3, 2006, Lee.
U.S. Appl. No. 11/404,591, filed Apr. 14, 2006, Moore.
U.S. Appl. No. 11/413,286, filed Apr. 28, 2006, Lee et al.
U.S. Appl. No. 11/413,256, filed Apr. 28, 2006, Lee et al.
U.S. Appl. No. 11/445,654, filed Jun. 2, 2006, Moore.
U.S. Appl. No. 11/482,586, filed Jul. 6, 2006, Lee et al.
Aboaf, J.A. et al., IBM Technical Disclosure Bulletin, Rounding of Square-Shape Holes in Silicon Wafers, vol. 19, No. 8, p. 3042, Jan. 1977, XP-002235690, NN 77013042.
ATMI, Inc., adapted from a presentation at the Semicon West '99 Low Dielectric Materials Technology Conference, San Francisco, California, Jul. 12, 1999, pp. 13-25.
Bassous, E., IBM Technical Disclosure Bulletin, Low Temperature Methods for Rounding Silicon Nozzles, vol. 20, No. 2, Jul. 1977, pp. 810-811, XP-002235692, NN 7707810.
Bernhardt, A.F., et al., "Electrochemical Planarization for Multi-Level Metallization of Microcircuitry," CircuiTree, vol. 8, No. 10, pp. 38, 40, 42, 44, 46, and 48, Oct. 1995.
D'Heurle, F.M., et al., IBM Technical Disclosure Bulletin, Electrolytic Process for Metal Pattern Generation, vol. 17, No. 1, pp. 271-272, Jun. 1974, XP-002235691, NN 7406271.
Frankenthal, R.P., et al., "Electroetching of Platinum in the Titanium-Platinum-Gold Metallization Silicon Integrated Circuits," Journal of The Electrochemical Society, vol. 123, No. 5, pp. 703-706, May 1976, Pennington, New Jersey.
Huang, C.S. et al., "A Novel UV Baking Process to Improve DUV Photoresist Hardness," pp. 135-138, Proceedings of the 1999 International Symposium, VLSI Technology, Systems, and Applications: Proceedings of Technical Papers: Jun. 8-10, 1999, Taipei, Taiwan, Institute of Electrical and Electronics Engineers, Inc., Sep. 1999.
Juchniewicz, R. et al. "Influence of Pulsed Current Plantinised Titanium and Tantalum Anode Durability," International Congress Metallic Corrosion, Proceedings—vol. 3, pp. 449-453, Toronto, Jun. 3/7, 1984.
Kondo, S. et al., "Abrasive-Free Polishing for Copper Damascene Interconnection," Journal of the Electrochemical Society, vol. 147, No. 10, pp. 3907-3913, The Electrochemical Society, Inc., Pennington, New Jersey, 2000.
McGraw-Hill, "Chemical bonding," Concise Encyclopedia of Science & Technology, Fourth Edition, Sybil P. Parker, Editor in Chief, p. 367, McGraw-Hill, New York, 1998.
Micro Photonics, Inc. CSM Application Bulletin. Low-load Micro Scratch Tester (MST) for characterization of thin polymer films [online], 3 pages, retrieved from the Internet Jul. 25, 2002. <http://www.microphotonics.com/mstABpoly.html>.
Micro Photonics, Inc. CSM Nano Hardness Tester [online], 6 pages, retrieved from the Internet Jul. 29, 2002. <http://www.microphotonics.com/nht.html>.
PhysicsWorld. Hard Materials (excerpt of Superhard superlattices) [online], S. Barnett and A. Madan, Physics World, Jan. 1998, Institute of Physics Publishing Ltd., Bristol, United Kingdom, retrieved from the Internet, Jul. 29, 2002 <http://physicsweb.org/box/world/11/1/11/world-11-1-11-1>.
PCT International Search Report for International Application No. PCT/US02/19495, Mar. 31, 2003, 6 pages.
PCT Written Opinion for International Application No. PCT/US02/19495, Jun. 10, 2003, 7 pages.
Notice of Patent Grant (translation) issued Sep. 26, 2006 in Korea Application No. 10-2003-7016758.
Notification of Grant of Invention Patent (translation) for China Application No. 02812457.X.
Office Action (translation) issued Apr. 28, 2008 in Japan Application No. 2003-507878.
Office Action (translation) issued Dec. 14, 2007 in China Application No. 02812457.X.
Office Action (translation) issued Feb. 25, 2008 for Japan Application No. 2004-531540.
Office Action (translation) issued Jun. 29, 2007 for China Application No. 02812457.X.
Office Action (translation) issued Oct. 24, 2005 in Korea Application No. 10-2003-7016758.
Wolf, S. et al., Silicon Processing for the VLSI Era, vol. 1: Process Technology, Lattice Press, 1989, pp. 188-189.

METHODS AND APPARATUS FOR ELECTRICAL, MECHANICAL AND/OR CHEMICAL REMOVAL OF CONDUCTIVE MATERIAL FROM A MICROELECTRONIC SUBSTRATE

CROSS-REFERENCE TO RELATED APPLICATIONS

This application is a divisional of U.S. application Ser. No. 09/888,084, now U.S. Pat. No. 7,112,121, filed Jun. 21, 2001, which is a continuation-in-part of U.S. application Ser. No. 09/651,779, now U.S. Pat. No. 7,074,113, filed Aug. 30, 2000, U.S. application Ser. No. 09/887,767, now U.S. Pat. No. 7,094,131, filed Jun. 21, 2001, and U.S. application Ser. No. 09/888,002, now U.S. Pat. No. 7,160,176, filed Jun. 21, 2001, all of which are incorporated herein in their entireties by reference.

TECHNICAL FIELD

This invention relates to methods and apparatuses for removing conductive material from microelectronic substrates.

BACKGROUND

Microelectronic substrates and substrate assemblies typically include a semiconductor material having features, such as memory cells, that are linked with conductive lines. The conductive lines can be formed by first forming trenches or other recesses in the semiconductor material, and then overlaying a conductive material (such as a metal) in the trenches. The conductive material is then selectively removed to leave conductive lines extending from one feature in the semiconductor material to another.

Electrolytic techniques have been used to both deposit and remove metallic layers from semiconductor substrates. For example, an alternating current can be applied to a conductive layer via an intermediate electrolyte to remove portions of the layer. In one arrangement, shown in FIG. 1, a conventional apparatus 60 includes a first electrode 20a and a second electrode 20b coupled to a current source 21. The first electrode 20a is attached directly to a metallic layer 11 of a semiconductor substrate 10 and the second electrode 20b is at least partially immersed in a liquid electrolyte 31 disposed on the surface of the metallic layer 11 by moving the second electrode downwardly until it contacts the electrolyte 31. A barrier 22 protects the first electrode 20a from direct contact with the electrolyte 31. The current source 21 applies alternating current to the substrate 10 via the electrodes 20a and 20b and the electrolyte 31 to remove conductive material from the conductive layer 11. The alternating current signal can have a variety of wave forms, such as those disclosed by Frankenthal et al. in a publication entitled, "Electroetching of Platinum in the Titanium-Platinum-Gold Metallization on Silicon Integrated Circuits" (Bell Laboratories), incorporated herein in its entirety by reference.

One drawback with the arrangement shown in FIG. 1 is that it may not be possible to remove material from the conductive layer 11 in the region where the first electrode 20a is attached because the barrier 22 prevents the electrolyte 31 from contacting the substrate 10 in this region. Alternatively, if the first electrode 20a contacts the electrolyte in this region, the electrolytic process can degrade the first electrode 20a. Still a further drawback is that the electrolytic process may not uniformly remove material from the substrate 10. For example, "islands" of residual conductive material having no direct electrical connection to the first electrode 20a may develop in the conductive layer 11. The residual conductive material can interfere with the formation and/or operation of the conductive lines, and it may be difficult or impossible to remove with the electrolytic process unless the first electrode 20a is repositioned to be coupled to such "islands."

One approach to addressing some of the foregoing drawbacks is to attach a plurality of first electrodes 20a around the periphery of the substrate 10 to increase the uniformity with which the conductive material is removed. However, islands of conductive material may still remain despite the additional first electrodes 20a. Another approach is to form the electrodes 20a and 20b from an inert material, such as carbon, and remove the barrier 22 to increase the area of the conductive layer 11 in contact with the electrolyte 31. However, such inert electrodes may not be as effective as more reactive electrodes at removing the conductive material, and the inert electrodes may still leave residual conductive material on the substrate 10.

FIG. 2 shows still another approach to addressing some of the foregoing drawbacks in which two substrates 10 are partially immersed in a vessel 30 containing the electrolyte 31. The first electrode 20a is attached to one substrate 10 and the second electrode 20b is attached to the other substrate 10. An advantage of this approach is that the electrodes 20a and 20b do not contact the electrolyte. However, islands of conductive material may still remain after the electrolytic process is complete, and it may be difficult to remove conductive material from the points at which the electrodes 20a and 20b are attached to the substrates 10.

Another method for removing material from a semiconductor substrate is chemical-mechanical planarization ("CMP"). Conventional CMP techniques include engaging the substrate with a polishing pad in a chemically active environment and then moving the polishing pad and/or the substrate relative to each other to chemically and/or mechanically remove material from the face of the substrate. The polishing pad can include fixed abrasive particles to abrade material from the substrate, or abrasive particles can be suspended in a liquid slurry disposed between the polishing pad and the substrate.

One drawback with conventional CMP techniques is that it may be extremely difficult or impossible to remove certain materials (such at platinum) from the substrate with such techniques. Alternatively, chemically etching materials, such as platinum, is not appropriate when the material is to be removed in a single direction (i.e., anisotropically) rather than in any direction (isotropically). Another drawback with conventional CMP techniques is that certain hard materials may be difficult to remove without applying a very large normal force to the substrate. Such a force can damage the substrate and can reduce the life expectancy of the CMP equipment.

International Application PCT/US00/08336 (published as WO/00/59682) discloses an apparatus having a first chamber for applying a conductive material to a semiconductor wafer, and a second chamber for removing conductive material from the semiconductor wafer by electropolishing or chemical-mechanical polishing. The second chamber includes an anode having a paint roller configuration with a cylindrical mechanical pad that contacts both an electrolyte bath and the face of the wafer as the anode and the wafer rotate about perpendicular axes. A cathode, which can include a conductive liquid isolated from the electrolytic bath, is electrically coupled to an edge of the wafer. One drawback with this device is that it, too, can leave islands of residual conductive material on the wafer.

SUMMARY

The present invention is directed toward methods and apparatuses for removing conductive materials from microelectronic substrates. A method in accordance with one aspect of the invention includes engaging the microelectronic substrate with the polishing surface of a polishing pad and electrically coupling a conductive material of the microelectronic substrate to a source of electrical potential while the microelectronic substrate is engaged with the polishing surface of the polishing pad. For example, the method can include positioning first and second electrodes proximate to and spaced apart from a face surface of the microelectronic substrate, and disposing an electrolytic fluid between the face surface and the electrodes, with the electrodes in fluid communication with each other and the electrolytic fluid. In a further aspect of the invention, the first and second electrodes can face toward the face surface of the microelectronic substrate, with one electrode defining a cathode and the other electrode defining an anode. The method can further include oxidizing at least a portion of the conductive material by passing an electrical current through the conductive material from the source of electrical potential, and removing the portion of the conductive material from the microelectronic substrate by moving at least one of the microelectronic substrate and the polishing pad relative to the other. The conductive material can include a metal, such as platinum or another noble metal, or a semiconductor material, such as doped polysilicon.

In a further aspect of the invention, the method can include selecting characteristics of the electrolytic fluid. For example, the fluid can include a concentration of chlorine ions of from about 50 ppm to about 5,000 ppm. The fluid can include at least one of $(NH_4)_2SO_4$, $H_2SO_4$, $MgSO_4$, $K_2SO_4$ and $H_3PO_4$. The pH of the fluid can be less than about 3 or greater than about 10 when the conductive material includes platinum, less than about 3 or greater than about 4 when the conductive material includes tungsten, and/or less than about 6 or greater than about 8 when the conductive material includes copper.

A method in accordance with another aspect of the invention includes providing a microelectronic substrate having a first conductive material disposed adjacent to a second conductive material, with the second conductive material having a different composition than the first conductive material. The first conductive material is engaged with the polishing surface of a polishing pad and is electrically coupled to a source of electrical potential by positioning first and second electrodes apart from the face surface and disposing a first electrolytic fluid between the face surface and the electrodes, with both the electrodes in fluid communication with the first electrolytic fluid. At least a portion of the first conductive material is oxidized by passing an electrical current through the first conductive material while the first conductive material is engaged with the polishing surface. The method can further include removing the portion of the first conductive material from the microelectronic substrate by moving at least one of the microelectronic substrate and the polishing pad relative to the other. The second conductive material is then engaged with the polishing surface, coupled to the first and second electrodes with a second electrolytic fluid, and oxidized by passing an electrical current through the second conductive material. At least a portion of the second conductive material is then removed from the microelectronic substrate by relative movement of the substrate relative to the polishing pad. In a further aspect of this method, further removal of material from the microelectronic substrate can be halted by engaging the polishing surface with an oxide layer positioned beneath one of the conductive materials.

The invention is also directed toward an apparatus for removing conductive material from a microelectronic substrate. In one aspect of the invention, the apparatus can include a substrate support configured to engage the microelectronic substrate, and a material removal medium positioned proximate to the substrate support. The material removal medium can include a polishing pad having a polishing surface positioned to engage the microelectronic substrate during operation. The material removal medium can further include a liquid disposed on the polishing pad and at least one electrode positioned at least proximate to the substrate support and coupleable to a source of electrical potential. Neither the polishing pad nor the liquid has discrete abrasive elements. At least one of the material removal medium and the substrate support is movable relative to the other when the substrate support and the material removal medium engage the microelectronic substrate.

DETAILED DESCRIPTION

The present disclosure describes methods and apparatuses for removing conductive materials from a microelectronic substrate and/or substrate assembly used in the fabrication of microelectronic devices. As used herein, the term conductive materials includes, but is not limited to, metals, such as copper, platinum and aluminum, and semiconductor materials, such as doped polysilicon. Many specific details of certain embodiments of the invention are set forth in the following description and in FIGS. 3-14B to provide a thorough understanding of these embodiments. One skilled in the art, however, will understand that the present invention may have additional embodiments, or that the invention may be practiced without several of the details described below.

Figure 3:
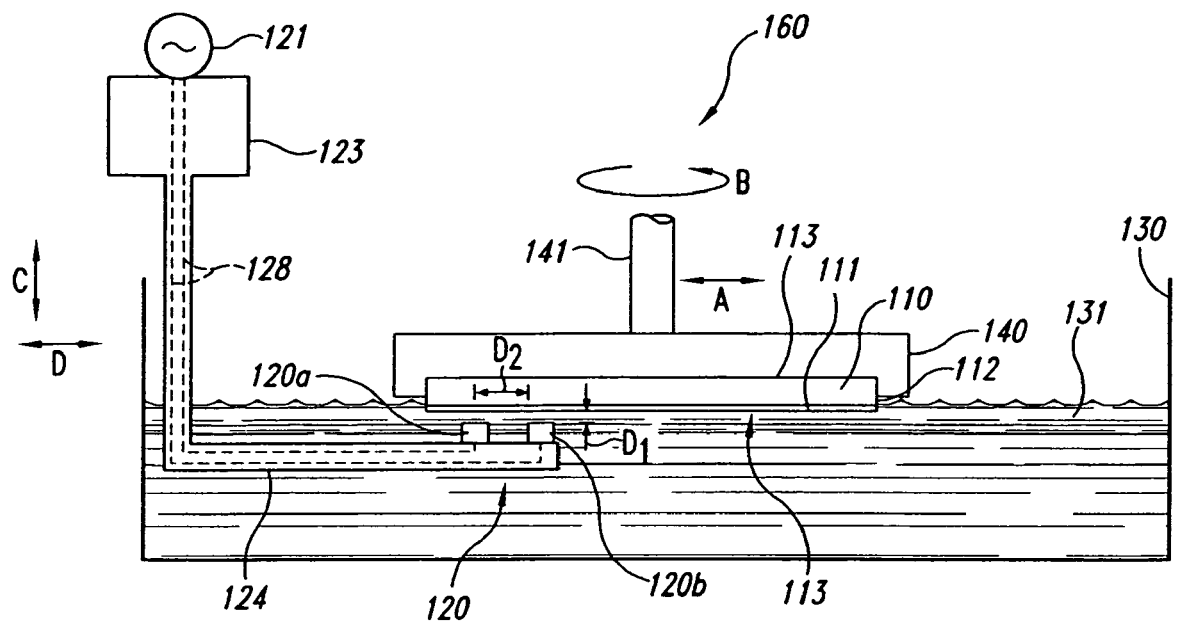
FIG. 3 is a partially schematic, side elevational view of an apparatus having a support member and a pair of electrodes for removing conductive material from a microelectronic substrate in accordance with an embodiment of the invention.

FIG. 3 is a partially schematic, side elevational view of an apparatus 160 for removing conductive material from a microelectronic substrate or substrate assembly 110 in accordance with an embodiment of the invention. In one aspect of this embodiment, the apparatus 160 includes a vessel 130 containing an electrolyte 131, which can be in a liquid or a gel state. As used herein, the terms electrolyte and electrolytic fluid refer generally to electrolytic liquids and gels. Structures in fluid communication with electrolytic fluids are accordingly in fluid communication with electrolytic liquids or gels.

The microelectronic substrate 110 has an edge surface 112 and two face surfaces 113. A support member 140 supports the microelectronic substrate 110 relative to the vessel 130 so that a conductive layer 111 on at least one of the face surfaces 113 of the substrate 110 contacts the electrolyte 131. The conductive layer 111 can include metals such as platinum, tungsten, tantalum, gold, copper, rhodium, iridium, titanium or other conductive materials, such as doped polysilicon. In another aspect of this embodiment, the support member 140 is coupled to a substrate drive unit 141 that moves the support member 140 and the substrate 110 relative to the vessel 130. For example, the substrate drive unit 141 can translate the support member 140 (as indicated by arrow "A") and/or rotate the support member 140 (as indicated by arrow "B").

The apparatus 160 can further include a first electrode 120a and a second electrode 120b (referred to collectively as electrodes 120) supported relative to the microelectronic substrate 110 by a support member 124. In one aspect of this embodiment, the support arm 124 is coupled to an electrode drive unit 123 for moving the electrodes 120 relative to the microelectronic substrate 110. For example, the electrode drive unit 123 can move the electrodes toward and away from the conductive layer 111 of the microelectronic substrate 110, (as indicated by arrow "C"), and/or transversely (as indicated by arrow "D") in a plane generally parallel to the conductive layer 111. Alternatively, the electrode drive unit 123 can move the electrodes in other fashions, or the electrode drive unit 123 can be eliminated when the substrate drive unit 141 provides sufficient relative motion between the substrate 110 and the electrodes 120.

In either embodiment described above with reference to FIG. 3, the electrodes 120 are coupled to a current source 121 with leads 128 for supplying electrical current to the electrolyte 131 and the conductive layer 111. In operation, the current source 121 supplies an alternating current (single phase or multiphase) to the electrodes 120. The current passes through the electrolyte 131 and reacts electrochemically with the conductive layer 111 to remove material (for example, atoms or groups of atoms) from the conductive layer 111. The electrodes 120 and/or the substrate 110 can be moved relative to each other to remove material from selected portions of the conductive layer 111, or from the entire conductive layer 111.

In one aspect of an embodiment of the apparatus 160 shown in FIG. 3, a distance $D_1$ between the electrodes 120 and the conductive layer 111 is set to be smaller than a distance $D_2$ between the first electrode 120a and the second electrode 120b. Furthermore, the electrolyte 131 generally has a higher resistance than the conductive layer 11. Accordingly, the alternating current follows the path of least resistance from the first electrode 120a, through the electrolyte 131 to the conductive layer 111 and back through the electrolyte 131 to the second electrode 120b, rather than from the first electrode 120a directly through the electrolyte 131 to the second electrode 120b. Alternatively, a low dielectric material (not shown) can be positioned between the first electrode 120a and the second electrode 120b to decouple direct electrical communication between the electrodes 120 that does not first pass through the conductive layer 111.

Figure 1:
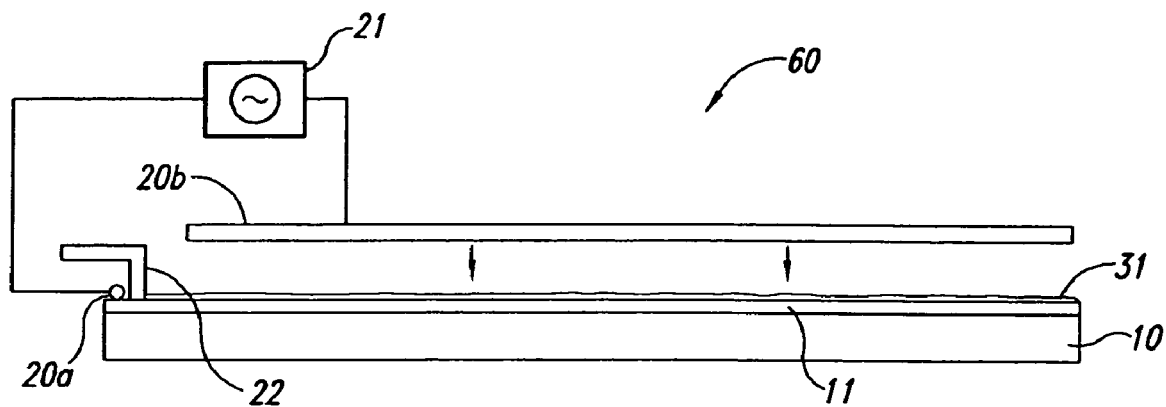
FIG. 1 is a partially schematic, side elevational view of an apparatus for removing conductive material from a semiconductor substrate in accordance with the prior art.
Figure 2:
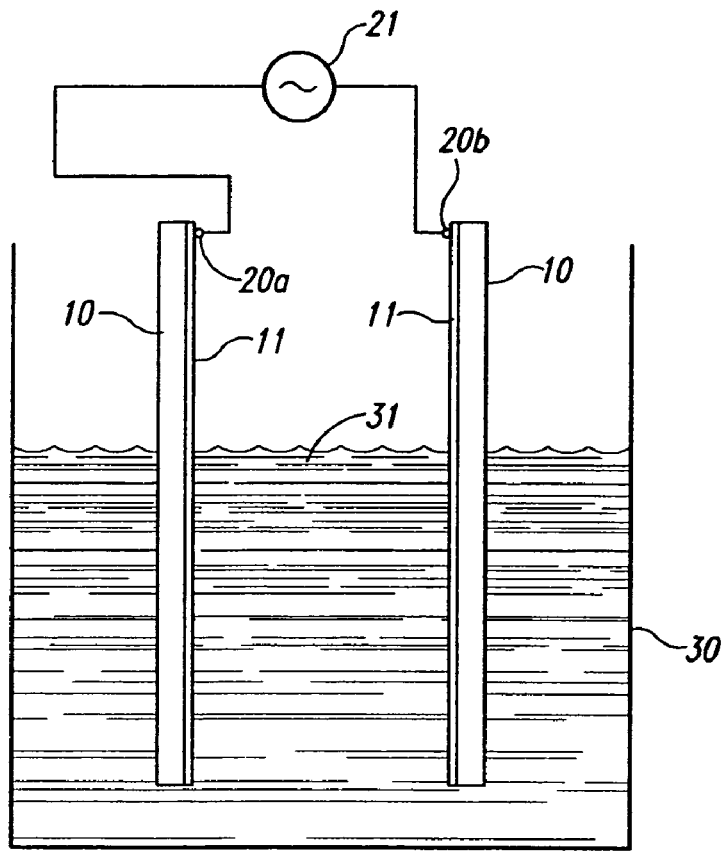
FIG. 2 is a partially schematic side, elevational view of another apparatus for removing conductive material from two semiconductor substrates in accordance with the prior art.

One feature of an embodiment of the apparatus 160 shown in FIG. 3 is that the electrodes 120 do not contact the conductive layer 111 of the substrate 110. An advantage of this arrangement is that it can eliminate the residual conductive material resulting from a direct electrical connection between the electrodes 120 and the conductive layer 111, described above with reference to FIGS. 1 and 2. For example, the apparatus 160 can eliminate residual conductive material adjacent to the contact region between the electrodes and the conductive layer because the electrodes 120 do not contact the conductive layer 111.

Another feature of an embodiment of the apparatus 160 described above with reference to FIG. 3 is that the substrate 110 and/or the electrodes 120 can move relative to the other to position the electrodes 120 at any point adjacent to the conductive layer 111. An advantage of this arrangement is that the electrodes 120 can be sequentially positioned adjacent to every portion of the conductive layer to remove material from the entire conductive layer 111. Alternatively, when it is desired to remove only selected portions of the conductive layer 111, the electrodes 120 can be moved to those selected portions, leaving the remaining portions of the conductive layer 111 intact.

Figure 4:
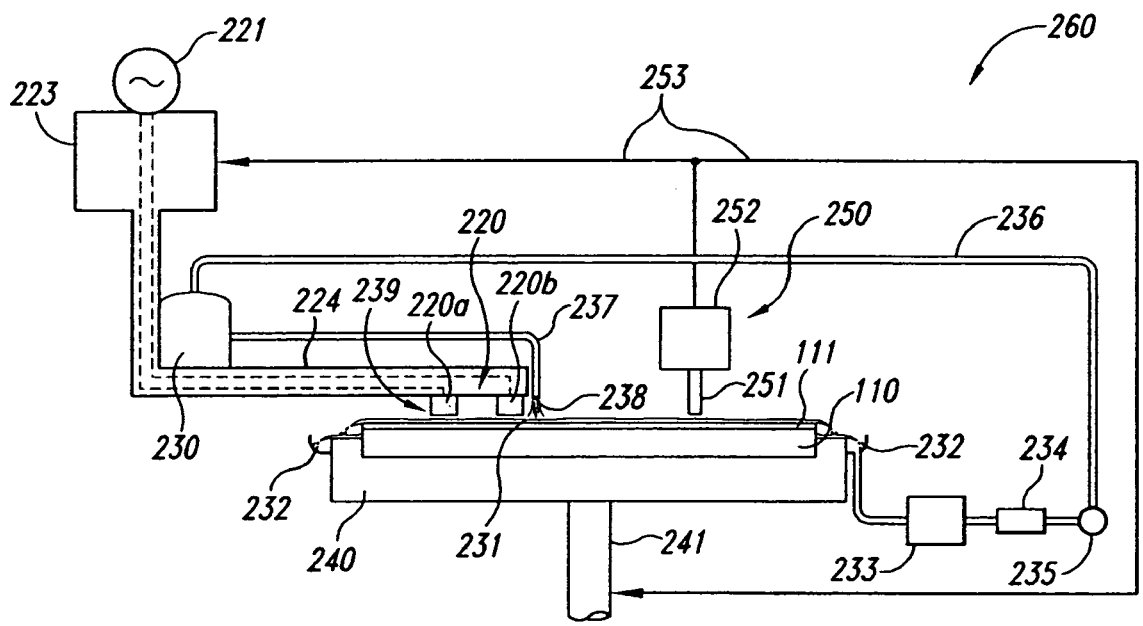
FIG. 4 is a partially schematic, side elevational view of an apparatus for removing conductive material and sensing characteristics of the microelectronic substrate from which the material is removed in accordance with another embodiment of the invention.

FIG. 4 is a partially schematic, side elevational view of an apparatus 260 that includes a support member 240 positioned to support the substrate 110 in accordance with another embodiment of the invention. In one aspect of this embodiment, the support member 240 supports the substrate 110 with the conductive layer 111 facing upwardly. A substrate drive unit 241 can move the support member 240 and the substrate 110, as described above with reference to FIG. 3. First and second electrodes 220a and 220b are positioned above the conductive layer 111 and are coupled to a current source 221. A support member 224 supports the electrodes 220 relative to the substrate 110 and is coupled to an electrode drive unit 223 to move the electrodes 220 over the surface of the support conductive layer 111 in a manner generally similar to that described above with reference to FIG. 3.

In one aspect of the embodiment shown in FIG. 4, the apparatus 260 further includes an electrolyte vessel 230 having a supply conduit 237 with an aperture 238 positioned proximate to the electrodes 220. Accordingly, an electrolyte 231 can be disposed locally in an interface region 239 between the electrodes 220 and the conductive layer 111, without necessarily covering the entire conductive layer 111. The electrolyte 231 and the conductive material removed from the conductive layer 111 flow over the substrate 110 and collect in an electrolyte receptacle 232. The mixture of electrolyte 231 and conductive material can flow to a reclaimer 233 that removes most of the conductive material from the electrolyte 231. A filter 234 positioned downstream of the reclaimer 233 provides additional filtration of the electrolyte 231 and a pump 235 returns the reconditioned electrolyte 231 to the electrolyte vessel 230 via a return line 236.

In another aspect of the embodiment shown in FIG. 4, the apparatus 260 can include a sensor assembly 250 having a sensor 251 positioned proximate to the conductive layer 111, and a sensor control unit 252 coupled to the sensor 251 for processing signals generated by the sensor 251. The control unit 252 can also move the sensor 251 relative to the substrate 110. In a further aspect of this embodiment, the sensor assembly 250 can be coupled via a feedback path 253 to the electrode drive unit 223 and/or the substrate drive unit 241. Accordingly, the sensor 251 can determine which areas of the conductive layer 111 require additional material removal and can move the electrodes 220 and/or the substrate 110 relative to each other to position the electrodes 220 over those areas. Alternatively, (for example, when the removal process is highly repeatable), the electrodes 220 and/or the substrate 110 can move relative to each other according to a pre-determined motion schedule.

The sensor 251 and the sensor control unit 252 can have any of a number of suitable configurations. For example, in one embodiment, the sensor 251 can be an optical sensor that detects removal of the conductive layer 111 by detecting a change in the intensity, wavelength or phase shift of the light reflected from the substrate 110 when the conductive material is removed. Alternatively, the sensor 251 can emit and detect reflections of radiation having other wavelengths, for example, x-ray radiation. In still another embodiment, the sensor 251 can measure a change in resistance or capacitance of the conductive layer 111 between two selected points. In a further aspect of this embodiment, one or both of the electrodes 220 can perform the function of the sensor 251 (as well as the material removal function described above), eliminating the need for a separate sensor 251. In still further embodiments, the sensor 251 can detect a change in the voltage and/or current drawn from the current supply 221 as the conductive layer 111 is removed.

In any of the embodiments described above with reference to FIG. 4, the sensor 251 can be positioned apart from the electrolyte 231 because the electrolyte 231 is concentrated in the interface region 239 between the electrodes 220 and the conductive layer 111. Accordingly, the accuracy with which the sensor 251 determines the progress of the electrolytic process can be improved because the electrolyte 231 will be less likely to interfere with the operation of the sensor 251. For example, when the sensor 251 is an optical sensor, the electrolyte 231 will be less likely to distort the radiation reflected from the surface of the substrate 110 because the sensor 251 is positioned away from the interface region 239.

Another feature of an embodiment of the apparatus 260 described above with reference to FIG. 4 is that the electrolyte 231 supplied to the interface region 239 is continually replenished, either with a reconditioned electrolyte or a fresh electrolyte. An advantage of this feature is that the electrochemical reaction between the electrodes 220 and the conductive layer 111 can be maintained at a high and consistent level.

Figure 5:
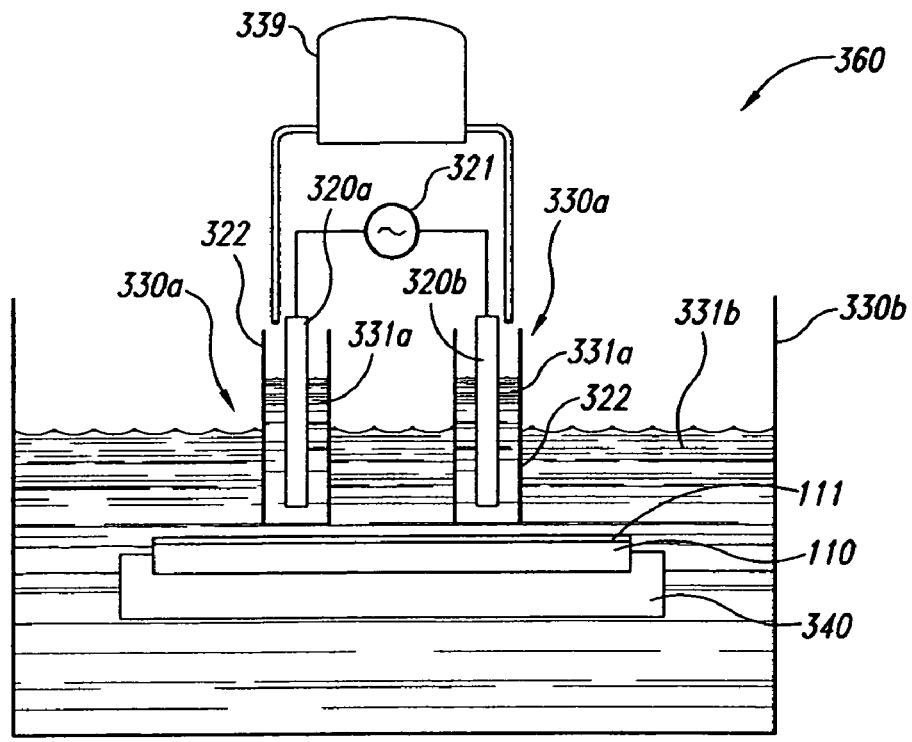
FIG. 5 is a partially schematic, side elevational view of an apparatus that includes two electrolytes in accordance with still another embodiment of the invention.

FIG. 5 is a partially schematic, side elevational view of an apparatus 360 that directs alternating current to the substrate 110 through a first electrolyte 331a and a second electrolyte 331b. In one aspect of this embodiment, the first electrolyte 331a is disposed in two first electrolyte vessels 330a, and the second electrolyte 331b is disposed in a second electrolyte vessel 330b. The first electrolyte vessels 330a are partially submerged in the second electrolyte 331b. The apparatus 360 can further include electrodes 320, shown as a first electrode 320a and a second electrode 320b, each coupled to a current supply 321 and each housed in one of the first electrolyte vessels 330a. Alternatively, one of the electrodes 320 can be coupled to ground. The electrodes 320 can include materials such as silver, platinum, copper and/or other materials, and the first electrolyte 331a can include sodium chloride, potassium chloride, copper sulfate and/or other electrolytes that are compatible with the material forming the electrodes 320.

In one aspect of this embodiment, the first electrolyte vessels 330a include a flow restrictor 322, such as a permeable isolation membrane formed from Teflon™, sintered materials such as sintered glass, quartz or sapphire, or other suitable porous materials that allow ions to pass back and forth between the first electrolyte vessels 330a and the second electrolyte vessel 330b, but do not allow the second electrolyte 330b to pass inwardly toward the electrodes 320 (for example, in a manner generally similar to a salt bridge). Alternatively, the first electrolyte 331a can be supplied to the electrode vessels 330a from a first electrolyte source 339 at a pressure and rate sufficient to direct the first electrolyte 331a outwardly through the flow restrictor 322 without allowing the first electrolyte 331a or the second electrolyte 330b to return through the flow restrictor 322. In either embodiment, the second electrolyte 331b remains electrically coupled to the electrodes 320 by the flow of the first electrolyte 331a through the restrictor 322.

In one aspect of this embodiment, the apparatus 360 can also include a support member 340 that supports the substrate 110 with the conductive layer 111 facing toward the electrodes 320. For example, the support member 340 can be positioned in the second electrolyte vessel 330b. In a further aspect of this embodiment, the support member 340 and/or the electrodes 320 can be movable relative to each other by one or more drive units (not shown).

One feature of an embodiment of the apparatus 360 described above with reference to FIG. 5 is that the first electrolyte 331a can be selected to be compatible with the electrodes 320. An advantage of this feature is that the first electrolyte 331a can be less likely than conventional electrolytes to degrade the electrodes 320. Conversely, the second electrolyte 331b can be selected without regard to the effect it has on the electrodes 320 because it is chemically isolated from the electrodes 320 by the flow restrictor 322. Accordingly, the second electrolyte 331b can include hydrochloric acid or another agent that reacts aggressively with the conductive layer 111 of the substrate 110.

Figure 6:
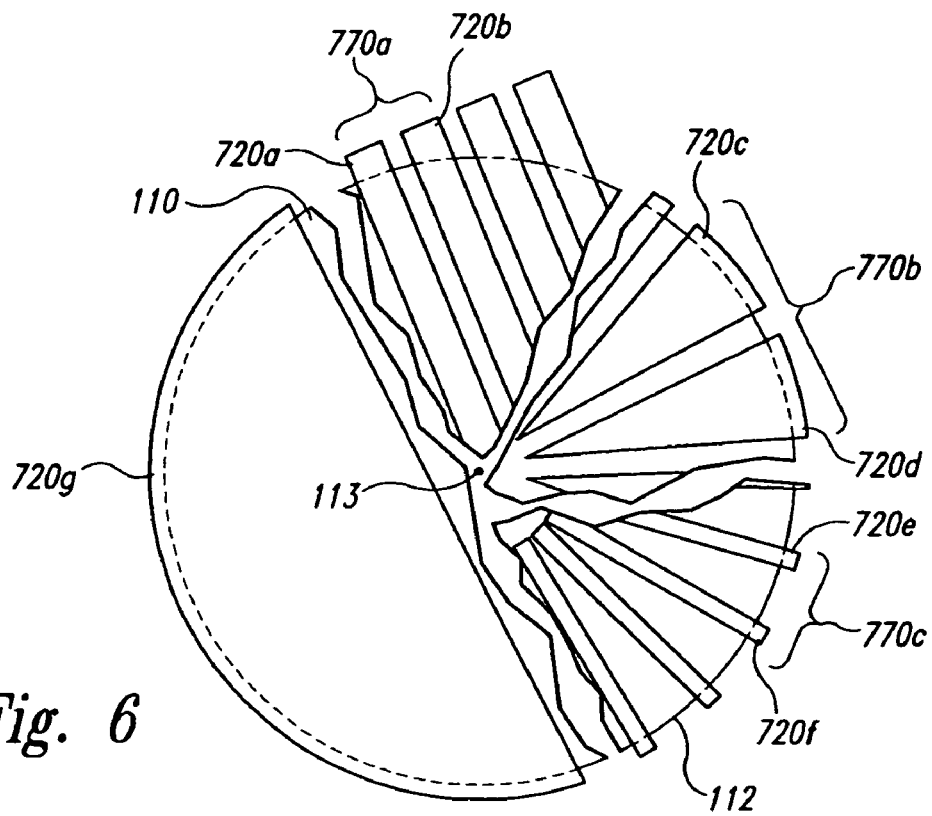
FIG. 6 is a partially schematic, plan view of a substrate adjacent to a plurality of electrodes in accordance with still further embodiments of the invention.

FIG. 6 is a top plan view of the microelectronic substrate 110 positioned beneath a plurality of electrodes having shapes and configurations in accordance with several embodiments of the invention. For purposes of illustration, several different types of electrodes are shown positioned proximate to the same microelectronic substrate 110; however, in practice, electrodes of the same type can be positioned relative to a single microelectronic substrate 110.

In one embodiment, electrodes 720a and 720b can be grouped to form an electrode pair 770a, with each electrode 720a and 720b coupled to an opposite terminal of a current supply 121 (FIG. 3). The electrodes 770a and 770b can have an elongated or strip-type shape and can be arranged to extend parallel to each other over the diameter of the substrate 110. The spacing between adjacent electrodes of an electrode pair 370a can be selected to direct the electrical current into the substrate 110, as described above with reference to FIG. 3.

In an alternate embodiment, electrodes 720c and 720d can be grouped to form an electrode pair 770b, and each electrode 720c and 720d can have a wedge or "pie" shape that tapers inwardly toward the center of the microelectronic substrate 110. In still another embodiment, narrow, strip-type electrodes 720e and 720f can be grouped to form electrode pairs 770c, with each electrode 720e and 720f extending radially outwardly from the center 113 of the microelectronic substrate 110 toward the periphery 112 of the microelectronic substrate 110.

In still another embodiment, a single electrode 720g can extend over approximately half the area of the microelectronic substrate 110 and can have a semicircular planform shape. The electrode 720g can be grouped with another electrode (not shown) having a shape corresponding to a mirror image of the electrode 720g, and both electrodes can be coupled to the current source 121 to provide alternating current to the microelectronic substrate in any of the manners described above with reference to FIGS. 3-5.

Figure 7:
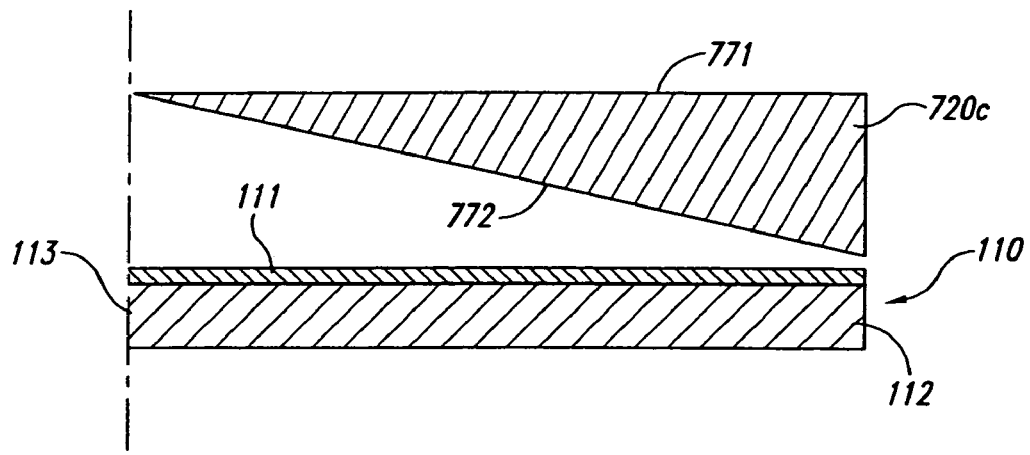
FIG. 7 is a cross-sectional, side elevational view of an electrode and a substrate in accordance with yet another embodiment of the invention.

FIG. 7 is a partially schematic, cross-sectional side elevational view of a portion of the substrate 110 positioned beneath the electrode 720c described above with reference to FIG. 6. In one aspect of this embodiment, the electrode 720c has an upper surface 771 and a lower surface 772 opposite the upper surface 771 and facing the conductive layer 111 of the substrate 110. The lower surface 772 can taper downwardly from the center 113 of the substrate 110 toward the perimeter 112 of the substrate 110 in one aspect of this embodiment to give the electrode 720c a wedge-shaped profile. Alternatively, the electrode 720c can have a plate-type configuration with the lower surface 772 positioned as shown in FIG. 7 and the upper surface 771 parallel to the lower surface 772. One feature of either embodiment is that the electrical coupling between the electrode 720c and the substrate 110 can be stronger toward the periphery 112 of the substrate 110 than toward the center 113 of the substrate 110. This feature can be advantageous when the periphery 112 of the substrate 110 moves relative to the electrode 720c at a faster rate than does the center 113 of the substrate 110, for example, when the substrate 110 rotates about its center 113. Accordingly, the electrode 720c can be shaped to account for relative motion between the electrode and the substrate 110.

In other embodiments, the electrode 720c can have other shapes. For example, the lower surface 772 can have a curved rather than a flat profile. Alternatively, any of the electrodes described above with reference to FIG. 6 (or other electrodes having shapes other than those shown in FIG. 6) can have a sloped or curved lower surface. In still further embodiments, the electrodes can have other shapes that account for relative motion between the electrodes and the substrate 110.

Figure 8A:
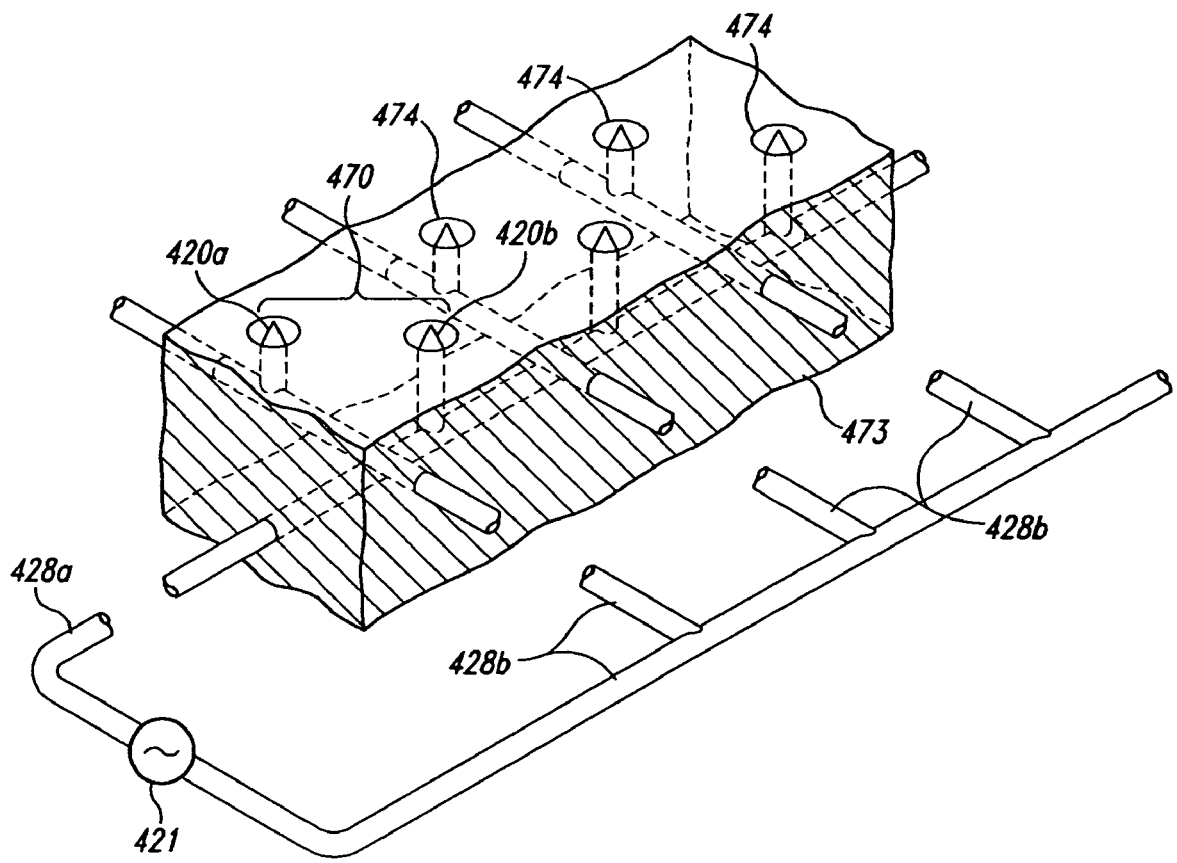
FIG. 8A is a partially schematic, isometric view of a portion of a support for housing electrode pairs in accordance with still another embodiment of the invention.

FIG. 8A is a partially schematic view of an electrode support 473 for supporting a plurality of electrodes in accordance with another embodiment of the invention. In one aspect of this embodiment, the electrode support 473 can include a plurality of electrode apertures 474, each of which houses either a first electrode 420a or a second electrode 420b. The first electrodes 420a are coupled through the apertures 474 to a first lead 428a and the second electrodes 420b are coupled to a second lead 428b. Both of the leads 428a and 428b are coupled to a current supply 421. Accordingly, each pair 470 of first and second electrodes 420a and 420b defines part of a circuit that is completed by the substrate 110 and the electrolyte(s) described above with reference to FIGS. 3-5.

In one aspect of this embodiment, the first lead 428a can be offset from the second lead 428b to reduce the likelihood for short circuits and/or capacitive coupling between the leads. In a further aspect of this embodiment, the electrode support 473 can have a configuration generally similar to any of those described above with reference to FIGS. 1-7. For example, any of the individual electrodes (e.g., 320a, 320c, 320e, or 320g) described above with reference to FIG. 6 can be replaced with an electrode support 473 having the same overall shape and including a plurality of apertures 474, each of which houses one of the first electrodes 420a or the second electrodes 420b.

In still a further aspect of this embodiment, the electrode pairs 470 shown in FIG. 8A can be arranged in a manner that corresponds to the proximity between the electrodes 420a, 420b and the microelectronic substrate 110 (FIG. 7), and/or the electrode pairs 470 can be arranged to correspond to the rate of relative motion between the electrodes 420a, 420b and the microelectronic substrate 110. For example, the electrode pairs 470 can be more heavily concentrated in the periphery 112 of the substrate 110 or other regions where the relative velocity between the electrode pairs 470 and the substrate 110 is relatively high (see FIG. 7). Accordingly, the increased concentration of electrode pairs 470 can provide an increased electrolytic current to compensate for the high relative velocity. Furthermore, the first electrode 420a and the second electrode 420b of each electrode pair 470 can be relatively close together in regions (such as the periphery 112 of the substrate 110) where the electrodes are close to the conductive layer 111 (see FIG. 7) because the close proximity to the conductive layer 111 reduces the likelihood for direct electrical coupling between the first electrode 420a and the second electrode 420b. In still a further aspect of this embodiment, the amplitude, frequency and/or waveform shape supplied to different electrode pairs 470 can vary depending on factors such as the spacing between the electrode pair 470 and the microelectronic substrate 110, and the relative velocity between the electrode pair 470 and the microelectronic substrate 110.

Figure 8B:
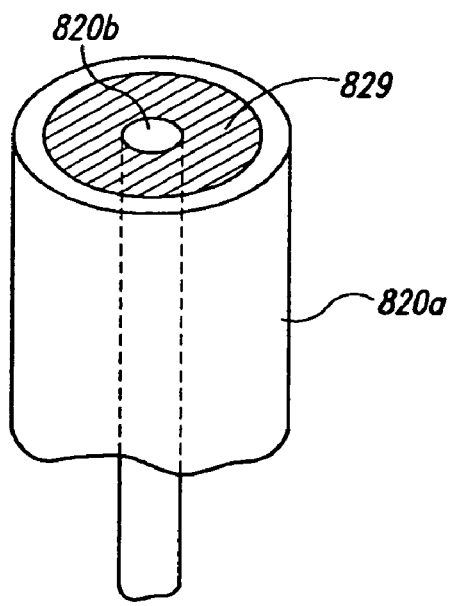
FIGS. 8B and 8C are isometric views of electrodes in accordance with still further embodiments of the invention.
Figure 8C:
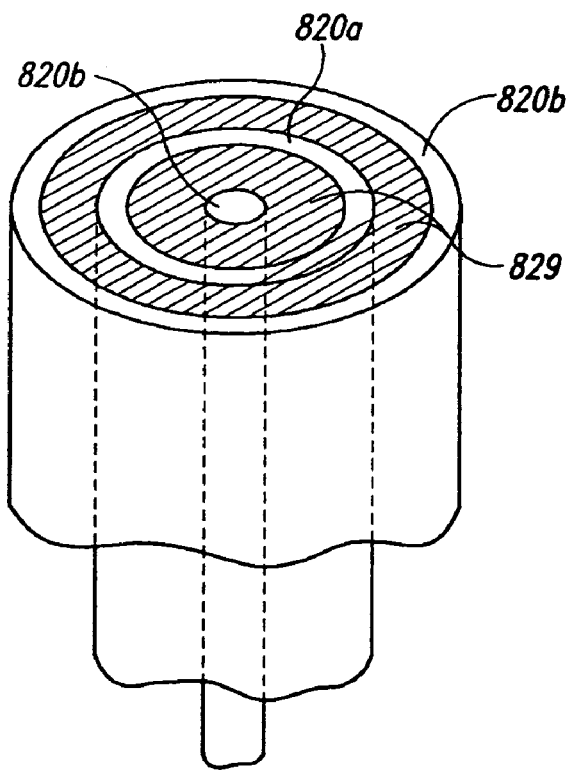

FIGS. 8B and 8C illustrate electrodes 820 (shown as first electrodes 820a and second electrodes 820b) arranged concentrically in accordance with still further embodiments of the invention. In one embodiment shown in FIG. 8B, the first electrode 820a can be positioned concentrically around the second electrode 820b, and a dielectric material 829 can be disposed between the first electrode 820a and the second electrode 820b. The first electrode 820a can define a complete 360° arc around the second electrode 820b, as shown in FIG. 8B, or alternatively, the first electrode 820a can define an arc of less than 360°.

In another embodiment, shown in FIG. 8C, the first electrode 820a can be concentrically disposed between two second electrodes 820b, with the dielectric material 829 disposed between neighboring electrodes 820. In one aspect of this embodiment, current can be supplied to each of the second electrodes 820b with no phase shifting. Alternatively, the current supplied to one second electrode 820b can be phase-shifted relative to the current supplied to the other second electrode 820b. In a further aspect of the embodiment, the current supplied to each second electrode 820b can differ in characteristics other than phase, for example, amplitude.

One feature of the electrodes 820 described above with respect to FIGS. 8B and 8C is that the first electrode 820a can shield the second electrode(s) 820b from interference from other current sources. For example, the first electrode 820a can be coupled to ground to shield the second electrodes 820b. An advantage of this arrangement is that the current applied to the substrate 110 (FIG. 7) via the electrodes 820 can be more accurately controlled.

Figure 9:
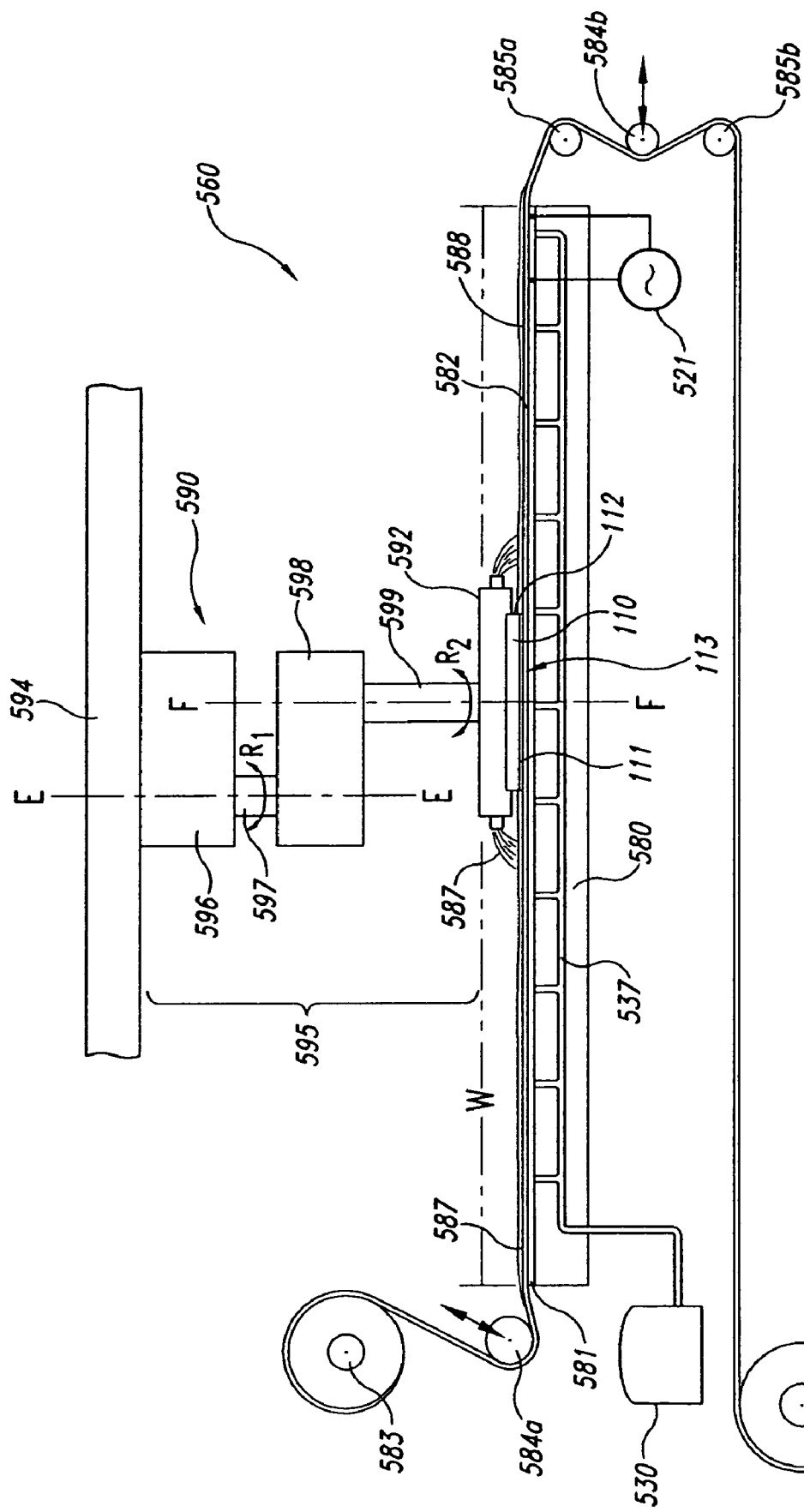
FIG. 9 is a partially schematic, side elevational view of an apparatus for both planarizing and electrolytically processing microelectronic substrates in accordance with yet another embodiment of the invention.

FIG. 9 schematically illustrates an apparatus 560 for chemically, mechanically and/or electrolytically processing the microelectronic substrate 110 in accordance with an embodiment of the invention. In one aspect of this embodiment, the apparatus 560 has a support table 580 with a top-panel 581 at a workstation where an operative portion "W" of a polishing pad 582 is positioned. The top-panel 581 is generally a rigid plate to provide a flat, solid surface to which a particular section of the polishing pad 582 may be secured during material removal processes.

The apparatus 560 can also have a plurality of rollers to guide, position and hold the polishing pad 582 over the top-panel 581. The rollers can include a supply roller 583, first and second idler rollers 584a and 584b, first and second guide rollers 585a and 585b, and a take-up roller 586. The supply roller 583 carries an unused or pre-operative portion of the polishing pad 582, and the take-up roller 583 carries a used or post-operative portion of the polishing pad 582. Additionally, the first idler roller 584a and the first guide roller 585a can stretch the polishing pad 582 over the top-panel 581 to hold the polishing pad 582 stationary during operation. A motor (not shown) drives at least one of the supply roller 583 and the take-up roller 586 to sequentially advance the polishing pad 582 across the top-panel 581. Accordingly, clean pre-operative sections of the polishing pad 582 may be quickly substituted for used sections to provide a consistent surface for polishing and/or cleaning the substrate 110.

The apparatus 560 can also have a carrier assembly 590 that controls and protects the substrate 110 during the material removal processes. The carrier assembly 590 can include a substrate holder 592 to pick up, hold and release the substrate 110 at appropriate stages of the material removal process. The carrier assembly 590 can also have a support gantry 594 carrying a drive assembly 595 that can translate along the gantry 594. The drive assembly 595 can have an actuator 596, a drive shaft 597 coupled to the actuator 596, and an arm 598 projecting from the drive shaft 597. The arm 598 carries the substrate holder 592 via a terminal shaft 599 such that the drive assembly 595 orbits the substrate holder 592 about an axis E-E (as indicated by arrow "$R_1$"). The terminal shaft 599 may also rotate the substrate holder 592 about its central axis F-F (as indicated by arrow "$R_2$").

In one embodiment, the polishing pad 582 and a planarizing solution 587 define at least a portion of a material removal medium that mechanically and/or chemically-mechanically removes material from the surface of the substrate 110. The polishing pad 582 used in the apparatus 560 can be a fixed-abrasive polishing pad having abrasive particles that are fixedly bonded to a suspension medium. Accordingly, the planarizing solution 587 can be a "clean solution" without abrasive particles because the abrasive particles are fixedly distributed across a polishing surface 588 of the polishing pad 582. In other applications, the polishing pad 582 may be a non-abrasive pad without abrasive particles, and the planarizing solution 587 can be a slurry with abrasive particles and chemicals to remove material from the substrate 110. In still further applications, both the polishing pad 582 and the planarizing solution 587 can be configured without abrasive particles or elements, as described in greater detail below with reference to FIGS. 9-11.

To remove material from the substrate 110 with the apparatus 560, the carrier assembly 590 presses the face 113 of the substrate 110 against the polishing surface 588 of the polishing pad 582 in the presence of the planarizing solution 587. The drive assembly 595 then orbits the substrate holder 592 about the axis E-E and optionally rotates the substrate holder 592 about the axis F-F to translate the substrate 110 across the planarizing surface 588. As a result, the abrasive particles and/or the chemicals in the material removal medium remove material from the surface of the substrate 110 in a chemical and/or chemical-mechanical planarization (CMP) process. Accordingly, in one embodiment, the polishing pad 582 can smooth the substrate 110 by removing rough features projecting from the conductive layer 111 of the substrate 110.

In a further aspect of this embodiment, the apparatus 560 can include an electrolyte supply vessel 530 that delivers an electrolyte to the planarizing surface 588 of the polishing pad 582 with a conduit 537, as described in greater detail with reference to FIG. 10. The apparatus 560 can further include a current supply 521 coupled to the support table 580 and/or the top-panel 581 to supply an electrical current to electrodes positioned in the support table 580 and/or the top-panel 581. Accordingly, the apparatus 560 can electrolytically remove material from the conductive layer 111 in a manner similar to that described above with reference to FIGS. 1-8C.

In one aspect of an embodiment of the apparatus 560 described above with reference to FIG. 9, material can be sequentially removed from the conductive layer 111 of the substrate 110 first by an electrolytic process and then by a CMP process. For example, the electrolytic process can remove material from the conductive layer 111 in a manner that roughens the conductive layer 111. After a selected period of electrolytic processing time has elapsed, the electrolytic processing operation can be halted and additional material can be removed via CMP processing. Alternatively, the electrolytic process and the CMP process can be conducted simultaneously. In either of these processing arrangements, one feature of an embodiment of the apparatus 560 described above with reference to FIG. 9 is that the same apparatus 560 can planarize the substrate 110 via CMP and remove material from the substrate 110 via an electrolytic process. An advantage of this arrangement is that the substrate 110 need not be moved from one apparatus to another to undergo both CMP and electrolytic processing.

Another advantage of an embodiment of the apparatus 560 described above with reference to FIG. 9 is that the processes, when used in conjunction with each other, are expected to remove material from the substrate 110 more quickly and accurately than some conventional processes. For example, as described above, the electrolytic process can remove relatively large amounts of material in a manner that roughens the microelectronic substrate 110, and the planarizing process can remove material on a finer scale in a manner that smoothes and/or flattens the microelectronic substrate 110.

Figure 10:
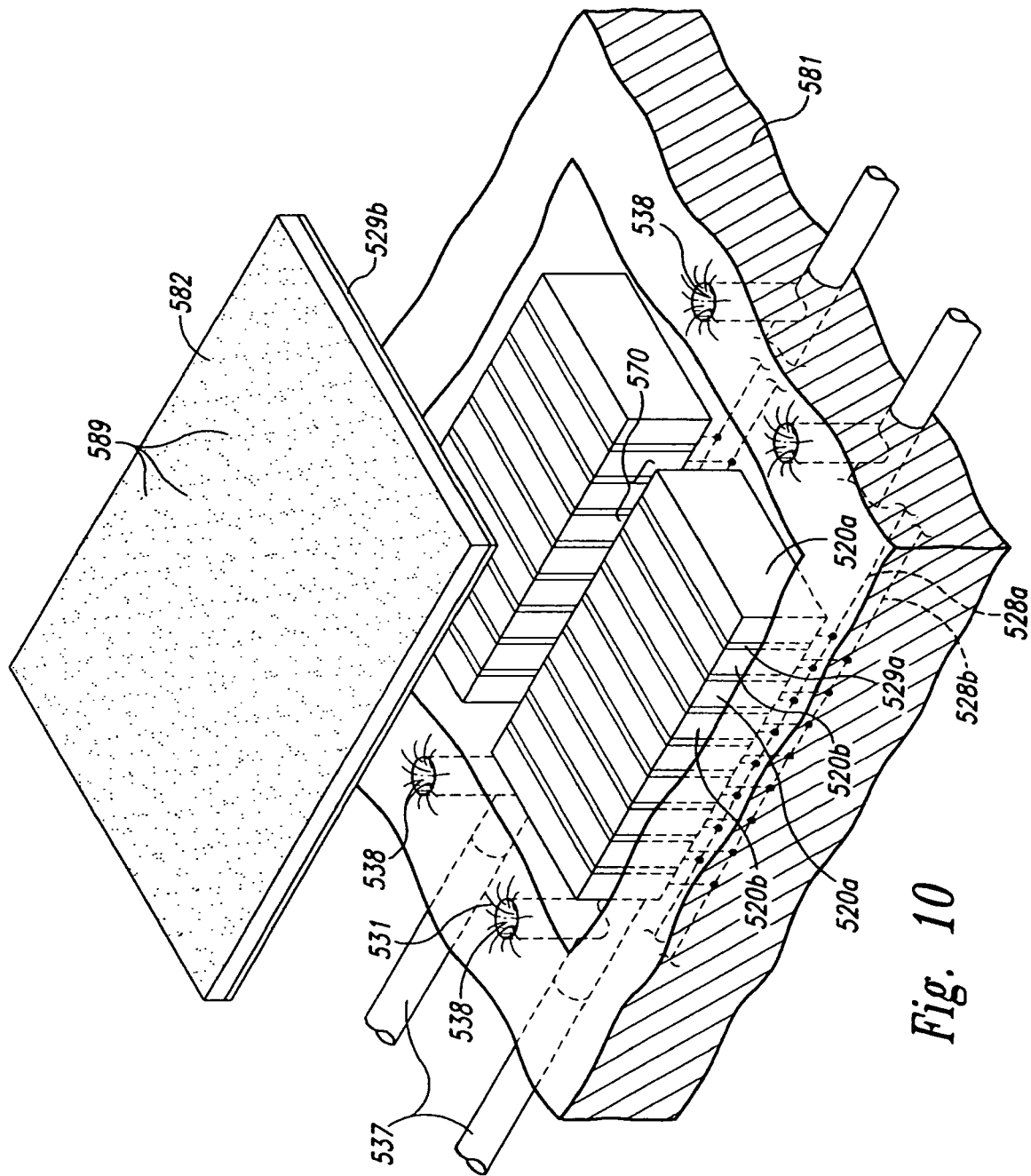
FIG. 10 is a partially schematic, partially exploded isometric view of a planarizing pad and a plurality of electrodes in accordance with still another embodiment of the invention.

FIG. 10 is a partially exploded, partially schematic isometric view of a portion of the apparatus 560 described above with reference to FIG. 9. In one aspect of an embodiment shown in FIG. 10, the top-panel 581 houses a plurality of electrode pairs 570, each of which includes a first electrode 520a and a second electrode 520b. The first electrodes 520a are coupled to a first lead 528a and the second electrodes 520b are coupled to a second lead 528b. The first and second leads 528a and 528b are coupled to the current source 521 (FIG. 9). In one aspect of this embodiment, the first electrode 520a can be separated from the second electrodes 520b by an electrode dielectric layer 529a that includes Teflon™ or another suitable dielectric material. The electrode dielectric layer 529a can accordingly control the volume and dielectric constant of the region between the first and second electrodes 520a and 520b to control electrical coupling between the electrodes.

The electrodes 520a and 520b can be electrically coupled to the microelectronic substrate 110 (FIG. 9) by the polishing pad 582. In one aspect of this embodiment, the polishing pad 582 is saturated with an electrolyte 531 supplied by the supply conduits 537 through apertures 538 in the top-panel 581 just beneath the polishing pad 582. Accordingly, the electrodes 520a and 520b are selected to be compatible with the electrolyte 531. In an alternate arrangement, the electrolyte 531 can be supplied to the polishing pad 582 from above (for example, by disposing the electrolyte 531 in the planarizing liquid 587) rather than through the top-panel 581. Accordingly, the polishing pad 582 can include a pad dielectric layer 529b positioned between the polishing pad 582 and the electrodes 520a and 520b. When the pad dielectric layer 529b is in place, the electrodes 520a and 520b are isolated from physical contact with the electrolyte 531 and can accordingly be selected from materials that are not necessarily compatible with the electrolyte 531. In either embodiment, the electrodes 520a and 520b can be in fluid communication with each other and the conductive layer 111 via a common volume of electrolyte 531. Each electrode 520a, 520b can be more directly electrically coupled to the conductive layer 111 (FIG. 9) than to the other electrode so that electrical current passes from one electrode through the conductive layer 111 to the other electrode.

In one aspect of an embodiment of the apparatus shown in FIG. 10, the electrodes 520a and 520b face toward the face surface 113 (FIG. 9) of the microelectronic substrate 110, with the polishing pad 582 interposed between the electrodes 520a and 520b and the face surface 113. As the microelectronic substrate 110 and the electrodes 520a and 520b move relative to each other, the electrodes can electrically couple to at least a substantial portion of the face surface 113. Accordingly, the likelihood for forming electrically isolated "islands" in the conductive layer 111 (FIG. 9) at the face surface 113 can be reduced when compared to conventional devices. Alternatively, if the apparatus includes only two electrodes, each configured to face toward about one-half of the face surface 113 (in a manner generally similar to that described above with reference to electrode 220g of FIG. 6), then the electrodes can also electrically coupled to at least a substantial portion of the face surface 113.

In any of the embodiments described above with reference to FIG. 10, the polishing pad 582 can provide several additional advantages over some conventional electrolytic arrangements. For example, the polishing pad 582 can uniformly separate the electrodes 520a and 520b from the microelectronic substrate 110 (FIG. 9), which can increase the uniformity with which the electrolytic process removes material from the conductive layer 111 (FIG. 9). The polishing pad 582 can also have abrasive particles 589 for planarizing the microelectronic substrate 110 in the manner described above with reference to FIG. 9. Furthermore, the polishing pad 582 can filter carbon or other material that erodes from the electrodes 520a and 520b to prevent the electrode material from contacting the microelectronic substrate 110. Still further, the polishing pad 582 can act as a sponge to retain the electrolyte 531 in close proximity to the microelectronic substrate 110.

Figure 11:
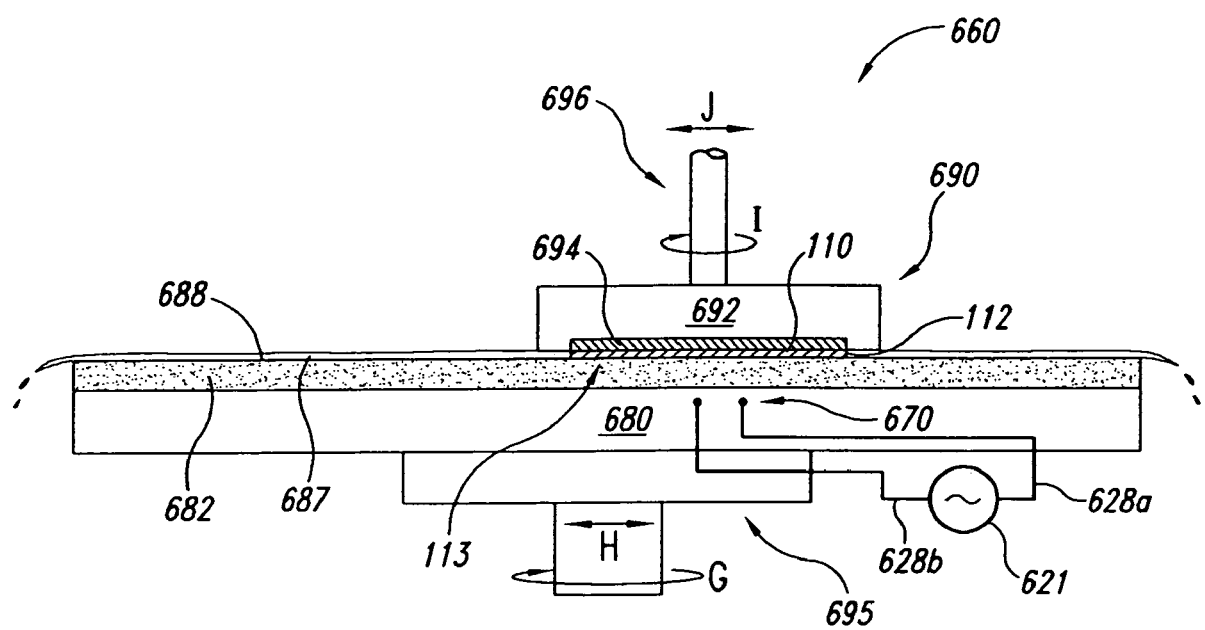
FIG. 11 is a partially schematic, side elevational view of an apparatus for both planarizing and electrolytically processing microelectronic substrates in accordance with still another embodiment of the invention.

FIG. 11 is a partially schematic, cross-sectional side elevational view of a rotary apparatus 660 for mechanically, chemically and/or electrolytically processing the microelectronic substrate 110 in accordance with another embodiment of the invention. In one aspect of this embodiment, the apparatus 660 has a generally circular platen or table 680, a carrier assembly 690, a polishing pad 682 positioned on the table 680, and a planarizing liquid 687 on the polishing pad 682. The polishing pad 682 can be a fixed abrasive polishing pad or, alternatively, the planarizing liquid 687 can be a slurry having a suspension of abrasive elements and the polishing pad 682 can be a non-abrasive pad. A drive assembly 695 rotates (arrow "G") and/or reciprocates (arrow "H") the platen 680 to move the polishing pad 682 during planarization. Accordingly, the motion of the microelectronic substrate 110 relative to the polishing pad 682 can include circular, elliptical, orbital, precessional or non-precessional motions.

The carrier assembly 690 controls and protects the microelectronic substrate 110 during the material removal process. The carrier assembly 690 typically has a substrate holder 692 with a pad 694 that holds the microelectronic substrate 110 via suction. A drive assembly 696 of the carrier assembly 690 typically rotates and/or translates the substrate holder 692 (arrows "I" and "J," respectively). Alternatively, the substrate holder 692 may include a weighted, free-floating disk (not shown) that slides over the polishing pad 682.

To planarize the microelectronic substrate 110 with the apparatus 660 in one embodiment, the carrier assembly 690 presses the microelectronic substrate 110 against a polishing surface 688 of the polishing pad 682. The platen 680 and/or the substrate holder 692 then move relative to one another to translate the microelectronic substrate 110 across the polishing surface 688. As a result, the abrasive particles in the polishing pad 682 and/or the chemicals in the planarizing liquid 687 remove material from the surface of the microelectronic substrate 110.

The apparatus 660 can also include a current source 621 coupled with leads 628a and 628b to one or more electrode pairs 670 (one of which is shown in FIG. 11). The electrode pairs 670 can be integrated with the platen 680 in generally the same manner with which the electrodes 520a and 520b (FIG. 10) are integrated with the top panel 581 (FIG. 10). Alternatively, the electrode pairs 670 can be integrated with the polishing pad 682. In either embodiment, the electrode pairs 670 can include electrodes having shapes and configurations generally similar to any of those described above with reference to FIGS. 3-10 to electrolytically remove conductive material from the microelectronic substrate 110. The electrolytic process can be carried out before, during or after the CMP process, as described above with reference to FIG. 9.

In other embodiments of the invention, the apparatuses described above with reference to FIGS. 3-11 can be used in accordance with other methods. For example, the electrolytic process can be used in addition to or in lieu of direct chemical interactions to oxidize conductive (including semiconductive) portions of the microelectronic substrate 110. In one aspect of this embodiment, the electrolytic process can oxidize metals (such as platinum, rhodium, iridium, or gold) that are normally difficult or nearly impracticable to oxidize. An advantage of this arrangement is that it can make the use of such metals more practical for microelectronic applications. For example, platinum and other noble metals that resist oxidation are generally difficult to remove from the microelectronic substrate 110 without employing an isotropic etching chemical (i.e., a chemical that etches indiscriminately in all directions) and/or a very high downforce applied to the microelectronic substrate by the polishing pad 682. The electrolytic process can anisotropically oxidize the platinum (or other conductive material) generally in a direction normal to the polishing surface 688 of the polishing pad 682.

Once the conductive material is oxidized, it can be removed from the microelectronic substrate 110. For example, it is believed that the electrolytic oxidation process roughens the surface of the conductive material and penetrates only a short distance beneath the surface. The oxidized material can then be removed by chemical and/or mechanical interactions with the polishing pad and/or planarizing solution. Furthermore, the downforce required to remove the oxidized material can be less than the downforce required by techniques that do not include an electrolytic process. In one specific example, it has been determined that a pressure of approximately 0.2 psi will remove 1,000 angstroms of platinum in ten minutes using an embodiment of the invention, whereas it is typically not possible to anisotropically remove platinum at any rate using conventional CMP techniques. Alternatively, the apparatuses described above with reference to FIGS. 9-11 can oxidize and remove materials other than platinum at higher rates and/or with lower downforces than are typically required with conventional CMP apparatuses.

An advantage of increasing the rate with which conductive material can be oxidized and removed from the microelectronic substrates 110 is that the throughput of microelectronic substrates 110 can be increased when compared to conventional techniques. An advantage of anisotropically oxidizing and removing the conductive material from the microelectronic substrates 110 is that this technique can remove overlayers of the conductive material without undercutting adjacent structures in a lateral direction. Accordingly, methods in accordance with embodiments of the invention can more reliably form vias, conductive lines, and other conductive structures in the microelectronic substrate 110. An advantage of reducing the downforce applied to the microelectronic substrate 110 during processing is that this technique can reduce the likelihood for damaging the microelectronic substrate 110 and can increase the life expectancy of the apparatus applying the downforce.

In a method in accordance with another embodiment of the invention, the characteristics of the electrical signal applied to the microelectronic substrate 110 can be selected to control the rate and/or manner with which the material is removed from the microelectronic substrate 110. For example, the amplitude of the electrical current can be increased to increase the rate at which the conductive material oxidizes, and accordingly, the rate at which the oxidized material is available for removal. Alternatively, the amplitude of the electrical current can be reduced to reduce the oxidation rate. In another embodiment, the current can be halted to control the rate at which conductive material is removed from the microelectronic substrate 110. For example, if the material is still susceptible to mechanical and/or chemical removal after the electrical current is halted, then halting the electrical current can slow, but not stop, the rate at which the material is removed. Alternatively, when mechanical removal and/or anisotropic chemical removal is not possible (for example, when the material includes platinum), then material removal can cease upon (or shortly after) halting the current applied to the conductive material. In any of these embodiments, the current amplitude can be varied from about 1 amp to about 10 amps, depending upon the desired oxidation and removal rate, and depending upon the type of material removed from the microelectronic substrate 110.

In a further embodiment, other characteristics of the electrical signal can be controlled to control the material oxidation and removal rate. For example, the voltage applied to the material can be increased or decreased to increase or decrease, respectively, the material oxidation and removal rates. In one embodiment, the voltage can be varied up to about 100 volts. In another embodiment, the frequency with which the electrical signal is applied can be varied to control the material oxidation and removal rate. In one specific embodiment, a potential of about 10 volts rms can be applied to a platinum layer of the microelectronic substrate at a frequency of about 60 Hz while the microelectronic substrate 110 is engaged with the polishing pad 582 to anisotropically remove a portion of the platinum from the microelectronic substrate 110.

In any of the foregoing embodiments, the polishing pad 582 can be a conventional pad, such as an IC 1000 polishing pad (available from Rodell, Inc. of Phoenix, Ariz.). In one aspect of this embodiment, the polishing pad 582 can have abrasive elements fixedly distributed in a suspension medium. Alternatively, the abrasive elements can be suspended in a planarizing liquid or slurry disposed between the polishing pad 582 and the microelectronic substrate 110. In either embodiment, the abrasive elements can include chromium dioxide, aluminum oxide or silicon dioxide, and the planarizing liquid can include an electrolyte to electrically couple the microelectronic substrate to a source of electrical potential. In still a further embodiment, the abrasive elements can be eliminated entirely from the material removal medium, and the material can be removed from the microelectronic substrate 110 as a result of the electrolytic process and contact with the polishing pad 582.

In yet a further embodiment, the electrical-mechanical interaction described above can be supplemented with a chemical interaction by exposing the microelectronic substrate 110 to one or more chemically reactive liquid solutions. In one aspect of this embodiment, the chemical solutions can be generally similar to those typically used for CMP processing. Alternatively, the chemical solutions, the chemical environment, and the chemical interactions can be different than those associated with conventional CMP techniques. For example, the solution can include an electrolytic fluid having $(NH_4)_2SO_4$, $H_2SO_4$, $K_2SO_4$, $MgSO_4$, and/or $H_3PO_4$. Alternatively, the fluid can have other constituents, such as those described below with reference to FIGS. 13A-C. The fluid can also include a relatively low concentration of chloride ions (e.g., from about 50 ppm to about 5,000 ppm for copper removal, and from about 100 ppm to about 5,000 ppm for platinum removal). In one specific example, suitable for platinum removal, the liquid can include a mixture of $(NH_4)_2SO_4$ at a concentration of from about 1M (moles/liter) to about 5.5M, $H_2SO_4$ at a concentration of up to about 0.5M, and about 500 ppm chloride ions. This is unlike typical planarizing liquids that include chlorine-based substances (such as KCl or HCl) and have much higher concentrations of chloride ions (for example, about 100,000 ppm).

An advantage of the chemical solutions described above is that they can more effectively remove materials, such as platinum, that are otherwise difficult to remove from the microelectronic substrate 110. It is believed that in one aspect of this embodiment, the chloride ions' can adsorb to the metal surface and roughen the exposed surface of the conductive material, making the conductive material easier to remove from the microelectronic substrate.

Another feature of the chemical solutions described above is that they can define a material removal environment that has a wider range of pHs than is typical for most conventional CMP operations. In fact, in one aspect of this embodiment, the pH of the environment can have any value from about 1 up to about 14. When the chemical solutions are used to remove platinum, the pH of the environment can be from about 1 to about 14, or, in a specific embodiment, less than about 3 or greater than about 10. While the pH of liquid typically used to planarize tungsten has a range from about 3 to about 4, the liquid in accordance with another aspect of the invention can have a pH of less than about 3 or greater than about 4. Still further, while the pH of a liquid typically used to planarize copper is about 7, the pH of a liquid in accordance with another aspect of the invention can have a pH of less than about 6 or greater than about 8. An advantage of the foregoing embodiments is that the user can select from a broader array of chemicals and chemical compounds to remove conductive material from the microelectronic substrate 110 because, so long as the compounds can electrically couple the conductive material to the adjacent electrodes, the compounds need not be selected on the basis of pH. As a result, the user can select chemicals that are less chemically reactive, easier to handle, and/or easier to dispose of after use than are typical CMP chemicals.

Figure 12A:
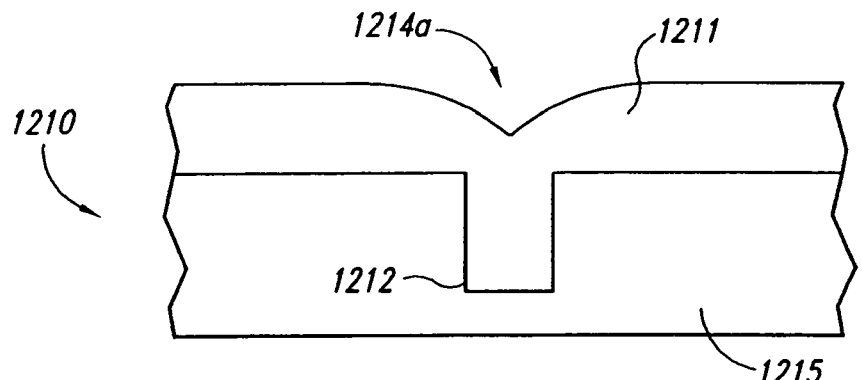
FIGS. 12A and 12B schematically illustrate a process for removing semiconductor material from a microelectronic substrate in accordance with an embodiment of the invention.
Figure 12B:
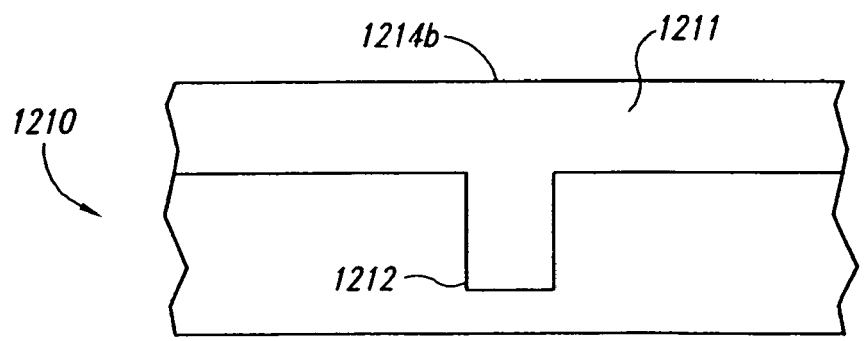

FIGS. 12A-B schematically illustrate applying the foregoing methods and apparatuses to removing semiconductor material 1211 from a microelectronic substrate 1210 in accordance with an embodiment of the invention. In one aspect of this embodiment, the microelectronic substrate 1210 can include a substrate material 1215 having a recess 1212 in which the semiconductor material 1211 is disposed. The substrate material can include a borophosphate silicon glass (BPSG) or another substrate material. In one embodiment, the semiconductor material 1211 can include polysilicon doped with phosphorous or boron, and in other embodiments, the semiconductor material 1211 can include other compositions. In any of these embodiments, the semiconductor material 1211 can have a recessed surface 1214a directly over the recess 1212. A portion of the semiconductor material 1211 can be removed to form a flat surface 1214b (FIG. 12b) by electrolytically oxidizing the semiconductor material 1211 and removing the semiconductor material 1211 with chemical and/or mechanical forces, generally as described above.

Conventional techniques for removing doped polysilicon include planarizing the polysilicon with a slurry having a pH of from about 10.5 to about 11.5. The conventional slurry typically includes tetramethyl ammonium hydroxide (TMAH) and a suspension of silicon dioxide abrasive particles. An advantage of a method for removing polysilicon and other semiconductor materials in accordance with an embodiment of the invention is that the material can be removed without the use of abrasive elements, and the material can be removed using an electrolytic fluid having a pH less than 10.5 or greater than 11.5. Accordingly, the user can select electrolytic fluids (such as those described above) having a wider variety of pHs than are conventionally used. For example, in one particular embodiment, the electrolytic fluid can include dilute hydrofluoric acid or a combination of ammonium hydroxide and TMAH. The voltage applied to the semiconductor material 1211 can range from about 25 volts rms to about 100 volts rms, for phosphorous-doped polysilicon. For boron-doped polysilicon, the electrolytic fluid can include a mixture of hydrofluoric acid and TMAH, and the voltage applied to the semiconductor material can be approximately the same as that discussed above for phosphorous-doped polysilicon.

A further advantage of a method in accordance with an embodiment of the invention is that the electrolytic fluid selected to remove the semiconductor material 1211 from the microelectronic substrate 1210 can be selected to have little or no chemical interaction with the substrate material 1215. Accordingly, for applications in which the semiconductor material 1211 is removed down to the level of the substrate material 1215, the removal process can automatically stop (i.e., endpoint) when the substrate material 1215 is exposed. Accordingly, the process can eliminate other more cumbersome and/or less accurate conventional endpointing techniques.

Figure 13A:
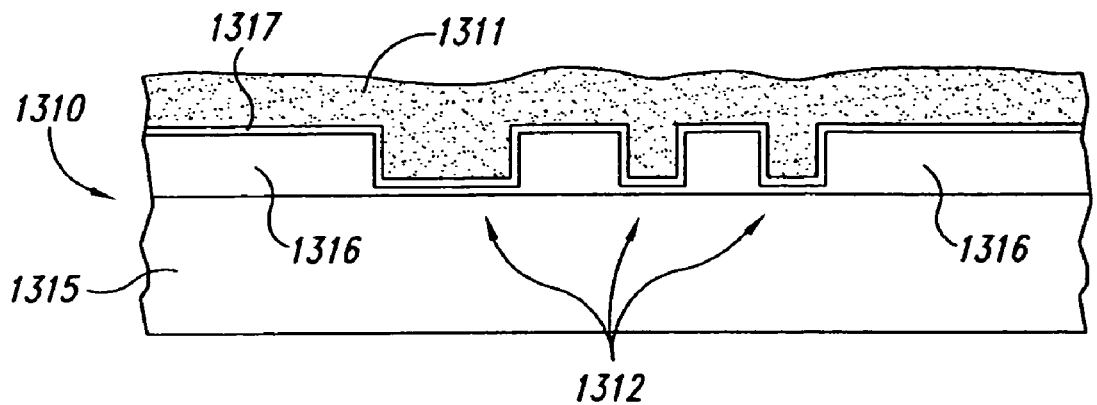
FIGS. 13A-C schematically illustrate a process for removing two conductive materials from a microelectronic substrate and halting removal on an oxide layer in accordance with an embodiment of the invention.
Figure 13B:
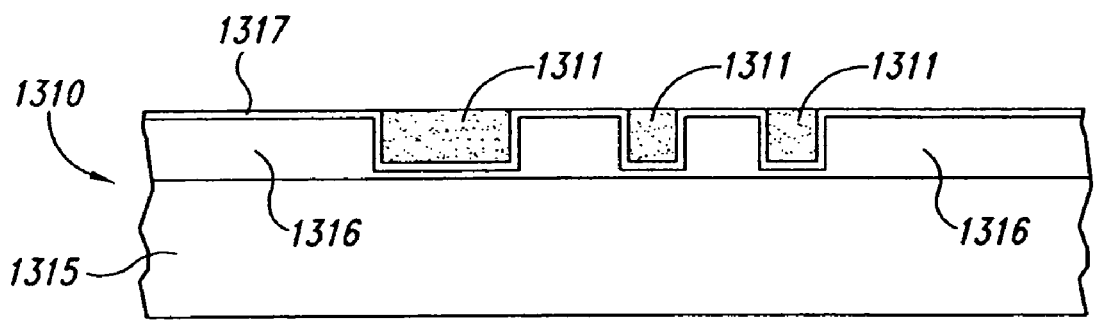
Figure 13C:
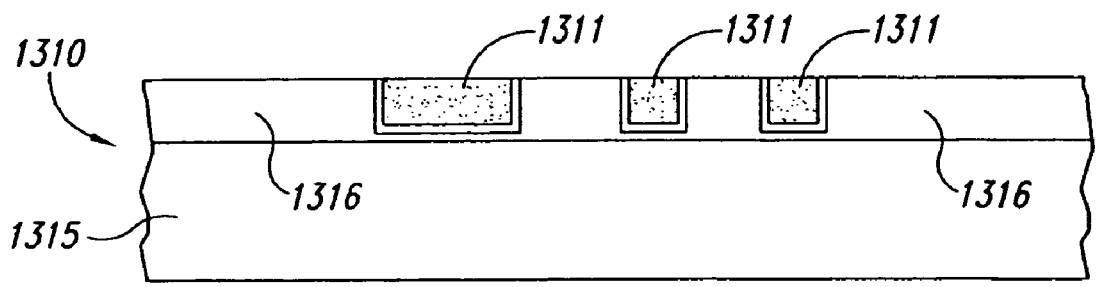

FIGS. 13A-C schematically illustrate methods for applying the foregoing techniques and apparatuses to removing a first conductive material 1311 and a second conductive material 1317 from a microelectronic substrate 1310. The microelectronic substrate 1310 can include a substrate material 1315 having a dielectric portion 1316 (such as an oxide layer) with recesses 1312 or other features formed in the dielectric portion 1316. The second conductive material 1317 is disposed in the recesses 1312 and on the dielectric portion 1316 (for example, in the form of a barrier layer), and the first conductive material 1311 is disposed on the second conductive material 1317. In one embodiment, the first conductive material 1311 can include copper and the second conductive material 1317 can include tantalum, tantalum nitride, tungsten, tungsten nitride, titanium, titanium nitride, titanium silicon nitride, and/or tantalum silicon nitride. In other embodiments, the first and second conductive materials 1311, 1317 can include other compositions.

Referring now to FIG. 13B, the first conductive material 1311 can be removed down to the level of the second conductive material 1317 using any of the devices described above with reference to FIGS. 9-11. In one aspect of this embodiment, the electrolytic fluid used to remove the first conductive material 1311 can include dilute $H_3PO_4$, or an organic acid, such as ammonium citrate. The electrolytic liquid can include chloride ions in concentrations generally similar to those described above. In one aspect of this embodiment, the concentration of the chloride ions can be used to control the rate at which the first conductive material 1311 is removed. For example, the peak removal rate can be achieved with a selected concentration of chloride ions that depends upon the other constituents of the electrolytic fluid and the composition of the first conductive material 1311. The material removal rate can decrease with either an increase or a decrease in the concentration of chloride ions from the selected concentration. In a further aspect of this embodiment, an alcohol (such as isopropyl alcohol or acetone) can be added to slow the rate of material removal, either in conjunction with, or in lieu of controlling the concentration of chloride ions.

When the first conductive material 1311 includes copper, the downforce applied to the first conductive material 1311 by the polishing pad can vary from less than 1 psi to several psi. Furthermore, the material of the electrode positioned at least proximate to the first conductive material 1311 can include platinum or graphite, and the potential applied to the electrodes can vary from about 1 volt to about 15 volts, depending upon the composition of the electrolytic liquid. Whether the first conductive material 1311 includes copper or another element, compound or mixture, the chemical interaction with the first conductive material 1311 can include an etching process, a complexing process, and/or a chelating process.

Referring now to FIG. 13C, the second conductive material 1317 can be removed down to the level of the dielectric portion 1316 using methods and apparatuses generally similar to those described above. In one particular aspect of this embodiment for which the second conductive material 1317 includes tantalum, the electrolytic fluid disposed on the second conductive material 1317 can include dilute hydrochloric acid, $NH_4Cl$, and/or dilute phosphoric acid, or any organic or inorganic acid. In a further aspect of this embodiment, the electrolytic fluid can include a corrosion inhibitor to inhibit corrosion of the exposed first conductive material 1311. For example, when the first conductive material 1311 includes copper, the corrosion inhibitor can include BTA. In a further aspect of this embodiment, the electrodes positioned proximate to the second conductive material 1317 can include graphite, and the voltage applied to the electrodes can be approximately the same as the voltage applied to the first conductive material 1311. Alternatively, the voltage applied to the second conductive material 1317 can be different. In one embodiment, the downforce applied to the second conductive material 1317 can be the same as the downforce applied to the first conductive material 1311, and alternatively, the downforce applied to the second conductive material 1317 can be different than the downforce applied to the first conductive material 1311.

In a further aspect of this embodiment, the process for removing the second conductive material 1317 can automatically stop when the polishing pad engages the initially buried dielectric portion 1316. Accordingly, an advantage of a method in accordance with an embodiment of the invention is that terminating the process for removing the second conductive material 1317 can be simpler than conventional techniques because a step specifically directed to endpointing is not required.

Another feature of a method in accordance with an embodiment of the invention described above is that the downforce applied to the microelectronic substrate 1310 while the first conductive material 1311 and the second conductive material 1317 are removed can be less than the downforces applied during conventional CMP operations (i.e., CMP operations that do not include electrolytically oxidizing the first and second conductive materials). As described above, an advantage of this feature is that the apparatus applying the downforce can have a longer life span. A further advantage is that the lower downforce may be less likely than conventional downforces to damage the substrate material 1315 and/or structures formed in the substrate material 1315 prior to applying the downforce. This feature may be particularly advantageous when the substrate material 1315 has a low dielectric constant, for example, a dielectric constant of from about 1.5 to about 3.0. Such materials can include porous silica.

Figure 14A:
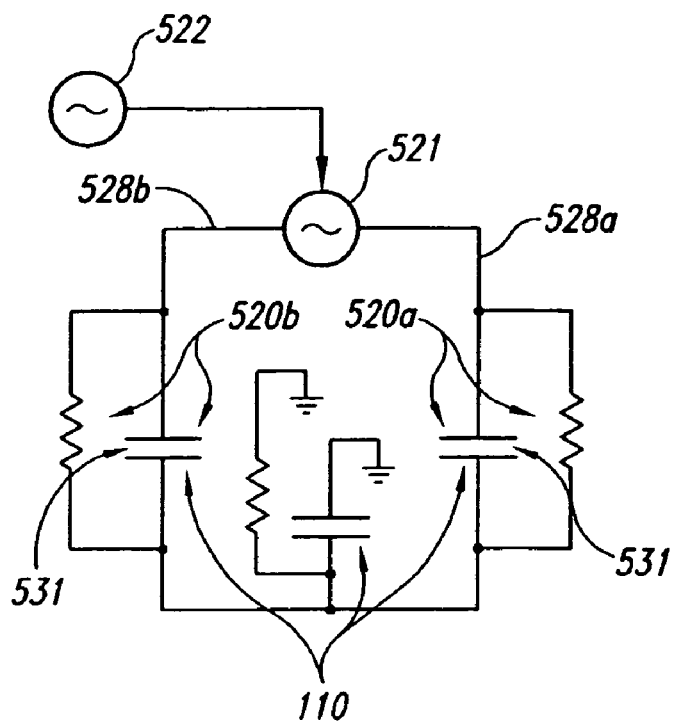
FIGS. 14A and 14B schematically illustrate a circuit and waveform for electrolytically processing a microelectronic substrate in accordance with yet another embodiment of the invention.

FIG. 14A is a schematic circuit representation of some of the components described above with reference to FIG. 10. The circuit analogy can also apply to any of the arrangements described above with reference to FIGS. 3-13C. As shown schematically in FIG. 14A, the current source 521 is coupled to the first electrode 520a and the second electrode 520b with leads 528a and 528b, respectively. The electrodes 520a and 520b are coupled to the microelectronic substrate 110 with the electrolyte 531 in an arrangement that can be represented schematically by two sets of parallel capacitors and resistors. A third capacitor and resistor schematically indicates that the microelectronic substrate 110 "floats" relative to ground or another potential.

Figure 14B:
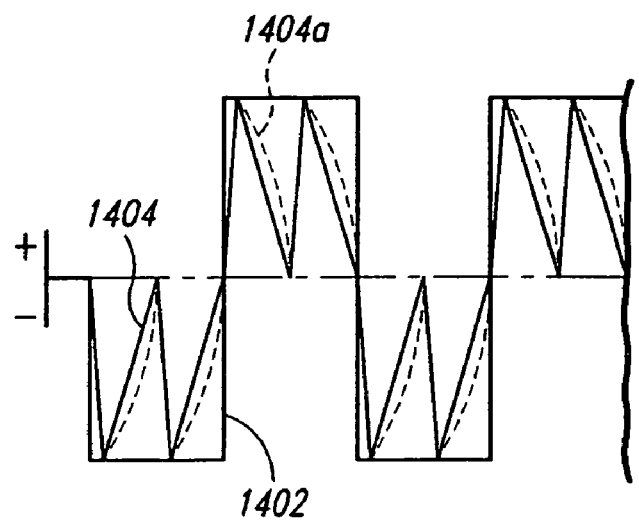

In one aspect of an embodiment shown in FIG. 14A, the current source 521 can be coupled to an amplitude modulator 522 that modulates the signal produced by the current source 521, as is shown in FIG. 14B. Accordingly, the current source 521 can generate a high-frequency wave 1404, and the amplitude modulator 522 can superimpose a low-frequency wave 1402 on the high-frequency wave 1404. For example, the high-frequency wave 1404 can include a series of positive or negative voltage spikes contained within a square wave envelope defined by the low-frequency wave 1402. Each spike of the high-frequency wave 1404 can have a relatively steep rise time slope to transfer charge through the dielectric to the electrolyte, and a more gradual fall time slope. The fall time slope can define a straight line, as indicated by high-frequency wave 1404, or a curved line, as indicated by high-frequency wave 1404a. In other embodiments, the high-frequency wave 1404 and the low-frequency wave 1402 can have other shapes depending, for example, on the particular characteristics of the dielectric material and electrolyte adjacent to the electrodes 420, the characteristics of the substrate 110, and/or the target rate at which material is to be removed from the substrate 110.

An advantage of this arrangement is that the high frequency signal can transmit the required electrical energy from the electrodes 520a and 520b to the microelectronic substrate 110, while the low frequency superimposed signal can more effectively promote the electrochemical reaction between the electrolyte 531 and the conductive layer 111 of the microelectronic substrate 110. Accordingly, any of the embodiments described above with reference to FIGS. 3-13C can include an amplitude modulator in addition to a current source.

From the foregoing, it will be appreciated that, although specific embodiments of the invention have been described herein for purposes of illustration, various modifications may be made without deviating from the spirit and scope of the invention. For example, some or all of the techniques described above in the context of a web-format apparatus (such as the one shown in FIG. 9) can be applied was well to a rotary apparatus (such as the one shown in FIG. 11) and vice versa. Accordingly, the invention is not limited except as by the appended claims.

The invention claimed is:

1. A method for removing material from a face surface of a microelectronic substrate, comprising:

providing a microelectronic substrate having a first conductive material disposed adjacent to a second conductive material, with the second conductive material having a different composition than the first conductive material;

engaging the first conductive material with a polishing surface of a polishing pad;

electrically coupling a first conductive material of the microelectronic substrate to a source of electrical potential by positioning first and second electrodes apart from the face surface and disposing a first electrolytic fluid between the face surface and the electrodes while the face surface is engaged with the polishing surface of the polishing pad, with both the electrodes in fluid communication with the first electrolytic fluid;

oxidizing at least a portion of the first conductive material by passing an electrical current through the first and second electrodes and the first conductive material while the first conductive material is engaged with the polishing surface;

removing the portion of the first conductive material from the microelectronic substrate by moving at least one of the microelectronic substrate and the polishing pad relative to the other;

engaging the second conductive material with the polishing surface of the polishing pad after removing the portion of the first conductive material;

electrically coupling the second conductive material of the microelectronic substrate to a source of electrical potential by positioning the first and second electrodes apart from the face surface and disposing a second electrolytic fluid between the face surface and the electrode while the face surface is engaged with the polishing surface of the polishing pad, with both the electrodes in fluid communication with the second electrolytic fluid;

oxidizing at least a portion of the second conductive material by passing an electrical current through the first and second electrodes and the second conductive material while the second conductive material is engaged with the polishing surface; and removing the portion of the second conductive material from the microelectronic substrate by moving at least one of the microelectronic substrate and the polishing pad relative to the other.

2. The method of claim 1, further comprising selecting the first conductive material to include copper and/or aluminum.

3. The method of claim 1, further comprising selecting a substrate material adjacent to the second conductive material to include porous silica.

4. The method of claim 1, further comprising selecting a dielectric material adjacent to the second conductive material to have a dielectric constant of from about 1.5 to about 3.

5. The method of claim 1, further comprising selecting the second conductive material to include tantalum, tantalum nitride, tungsten, tungsten nitride, titanium, titanium nitride, titanium silicon nitride and/or tantalum silicon nitride.

6. The method of claim 1, further comprising selecting the second conductive material to form a barrier between the first conductive material and a substrate material of the microelectronic substrate.

7. The method of claim 1, wherein the microelectronic substrate includes a dielectric portion, and wherein the method further comprises:
    forming a recess in the dielectric portion;
    disposing the second conductive material in the recess and on the dielectric portion to form a barrier layer; and
    disposing the first conductive material on the second conductive material.

8. The method of claim 1, further comprising selecting the first and second electrolytic fluids to have different chemical compositions.

9. The method of claim 1, further comprising selecting at least one of the electrolytic fluids to have a plurality of abrasive elements.

10. The method of claim 1, further comprising positioning the first and second electrodes to face toward a face surface of the microelectronic substrate with one electrode defining an anode and the other electrode defining a cathode.

11. The method of claim 1, further comprising selecting at least one of the electrodes to include graphite and/or platinum.

12. The method of claim 1, further comprising controlling a rate at which at least one of the conductive materials is removed from the microelectronic substrate by controlling a concentration of chloride ions and/or alcohol in at least one of the first and second electrolytic fluids.

13. The method of claim 1, further comprising selecting the second electrolytic fluid to include $H_3PO_4$ and/or an organic acid.

14. The method of claim 1, further comprising selecting the second electrolytic fluid to include HCl, $NH_4Cl$, an organic acid, and/or an inorganic acid.

15. The method of claim 1, further comprising selecting at least one of the first and second electrolytic fluids to include a corrosion inhibiting agent.

16. A method for endpointing removal of material from a microelectronic substrate, comprising: engaging the microelectronic substrate with a polishing surface of a polishing pad, the microelectronic substrate having a substrate material, a dielectric material adjacent to the substrate material, and a conductive material adjacent to the dielectric material; electrically coupling the conductive material of the microelectronic substrate to a source of electrical potential by positioning first and second electrodes proximate to and spaced apart from the conductive material;
    oxidizing at least a portion of the conductive material by passing an electrical current through the first and second electrodes and the conductive material from the source of electrical potential while the microelectronic substrate is engaged with the polishing surface of the polishing pad; removing the portion of the conductive material from the microelectronic substrate by moving at least one of the microelectronic substrate and the polishing pad relative to the other to expose the dielectric material; and halting further removal of material from the microelectronic substrate by engaging the dielectric material with the polishing surface of the polishing pad.

17. The method of claim 16 wherein electrically coupling the conductive material to the source of electrical potential further includes disposing an electrolytic fluid between the electrodes and the conductive material, with the electrodes in fluid communication with the electrolytic fluid, and wherein the method further comprises selecting the dielectric material to include an oxide.

18. The method of claim 16, further comprising selecting the conductive material to include a metal.

19. The method of claim 1 wherein the first electrolytic fluid contains chloride ions, and wherein the method further includes controlling a rate of removing the first conductive material from the microelectronic substrate by adjusting a concentration of the chloride ions in the first electrolytic fluid.

20. The method of claim 17, wherein the electrolytic fluid contains chloride ions, and wherein the method further includes controlling a rate of removing the conductive material from the microelectronic substrate by adjusting a concentration of the chloride ions in the electrolytic fluid.

* * * * *